US012660465B2

(12) United States Patent     (10) Patent No.:   US 12,660,465 B2

Shin et al.     (45) Date of Patent:    Jun. 16, 2026

(54) DISPLAY APPARATUS

(71) Applicant: Samsung Display Co., Ltd., Yongin-si (KR)

(72) Inventors: Hoyong Shin, Yongin-si (KR); Kanguk Kim, Yongin-si (KR); Junhwi Lim, Yongin-si (KR); Kangsoo Han, Yongin-si (KR); Minuk Kim, Yongin-si (KR); Seonuk Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 518 days.

(21) Appl. No.: 18/312,547

(22) Filed: May 4, 2023

(65) Prior Publication Data

US 2023/0371340 A1    Nov. 16, 2023

(30) Foreign Application Priority Data

May 16, 2022   (KR) ........................ 10-2022-0059847
Jul. 15, 2022   (KR) ........................ 10-2022-0087797

(51) Int. Cl.
   *H10K 59/38*      (2023.01)
   *H10K 59/122*    (2023.01)
   *H10K 59/80*     (2023.01)

(52) U.S. Cl.
   CPC ........... *H10K 59/38* (2023.02); *H10K 59/122* (2023.02); *H10K 59/8791* (2023.02)

(58) Field of Classification Search
   CPC .. H10K 59/38; H10K 59/122; H10K 59/8791; H10K 59/352; H10K 59/8792; H10K 50/19
   See application file for complete search history.

(56) References Cited

U.S. PATENT DOCUMENTS

| | | | |
|---|---|---|---|
| 11,163,195 B2 | 11/2021 | Lee et al. | |
| 11,309,361 B2 | 4/2022 | Jo et al. | |
| 2008/0036367 A1 | 2/2008 | Eida et al. | |
| 2021/0202587 A1 | 7/2021 | Kim et al. | |
| 2022/0359621 A1 | 11/2022 | Song et al. | |
| 2025/0040391 A1* | 1/2025 | Wang ..................... H10K 59/35 |

FOREIGN PATENT DOCUMENTS

| | | |
|---|---|---|
| KR | 10-2007-0049172 A | 5/2007 |
| KR | 10-2016-0017373 A | 2/2016 |
| KR | 10-2020-0083813 A | 7/2020 |
| KR | 10-2020-0085978 A | 7/2020 |
| KR | 10-2021-0086791 A | 7/2021 |

* cited by examiner

*Primary Examiner* — Anne M Hines
*Assistant Examiner* — Jose M Diaz
(74) *Attorney, Agent, or Firm* — Womble Bond Dickinson (US) LLP

(57) ABSTRACT

Provided is a display apparatus. One or more embodiments relate to display apparatuses. One or more embodiments include a display apparatus having good color reproducibility.

42 Claims, 19 Drawing Sheets

FIG. 8A

DISPLAY APPARATUS

CROSS-REFERENCE TO RELATED APPLICATIONS

This application claims priority to and the benefit of Korean Patent Application No. 10-2022-0059847, filed on May 16, 2022, and Korean Patent Application No. 10-2022-0087797, filed on Jul. 15, 2022, in the Korean Intellectual Property Office, the entire content of each of which is incorporated by reference herein.

BACKGROUND

1. Field

One or more embodiments of the present disclosure relate to apparatuses, and, for example, to display apparatuses.

2. Description of the Related Art

Electronic apparatuses based on mobility have been widely used. Recently, in addition to small electronic apparatuses such as mobile phones, tablet personal computers (PCs) have been widely used as mobile electronic apparatuses.

Such mobile electronic apparatuses include a display apparatus to provide visual information such as images or videos to a user in order to support various suitable functions. Recently, as other components for driving a display apparatus have been miniaturized, the proportion of a display apparatus in an electronic apparatus has increased gradually and a structure capable of being bent from a flat state to a certain angle has also been developed.

SUMMARY

A full-color display apparatus may include a display panel including a light emitting device that emits light and a color conversion panel including a filter unit that converts the color of the light emitted from the light emitting device. In this case, the color reproducibility of the display apparatus may be degraded depending on the configuration and arrangement of the filter unit. One or more embodiments include a display apparatus having good color reproducibility.

Additional aspects of embodiments will be set forth in part in the description which follows and, in part, will be apparent from the description, or may be learned by practice of the presented embodiments of the disclosure.

According to one or more embodiments, a display apparatus includes a display panel including a first light emitting device and a second light emitting device, and a color conversion panel including a color pattern that defines a first transparent area and a second transparent area respectively corresponding to the first light emitting device and the second light emitting device and a bank that defines a first opening portion and a second opening portion respectively corresponding to the first transparent area and the second transparent area, wherein at least one of a planar shape of the first opening portion and a planar shape of the second opening portion is a square, and, in a plan view, a first distance from a first point of an edge of the first transparent area to an edge of the first opening portion, which is measured in a first direction, and a second distance from a second point of an edge of the second transparent area arranged at a position corresponding to the first point to an edge of the second opening portion, which is measured in the first direction, are different from each other.

In the present embodiments, in a plan view, an area of the first transparent area and an area of the second transparent area may be different from each other.

In the present embodiments, in a plan view, the first opening portion and the second opening portion may have a same planar shape.

In the present embodiments, the first light emitting device and the second light emitting device may each emit a same color.

In the present embodiments, the first distance may be less than the second distance.

In the present embodiments, the first distance may be about 4.9 μm or more and less than about 30 μm.

In the present embodiments, the second distance may be about 5.5 μm or more and about 30 μm or less.

In the present embodiments, the second opening portion may be rectangular.

In the present embodiments, the first transparent area may be square.

In the present embodiments, the second transparent area may be rectangular or square.

In the present embodiments, a third distance measured at another point of the edge of the second opening portion in a second direction different from the first direction may be equal to or different from the second distance.

In the present embodiments, the color pattern may include a first color filter arranged in the first transparent area and a second color filter arranged in the second transparent area.

In the present embodiments, the color pattern may further include a third color filter including a pattern area that exposes the first transparent area and the second transparent area.

In the present embodiments, the first transparent area and the second transparent area may be defined as the third color filter.

In the present embodiments, the first color filter may transmit light of a red wavelength, and the second color filter may transmit light of a blue wavelength.

In the present embodiments, the color conversion panel may further include a first quantum dot arranged in the first opening portion and a second quantum dot arranged in the second opening portion.

In the present embodiments, a first width of the first opening portion and a second width of the second opening portion measured in the first direction may be equal to each other.

According to one or more embodiments, a display apparatus includes a display panel including a first light emitting device and a second light emitting device, and a color conversion panel including a color pattern that defines a first transparent area and a second transparent area respectively corresponding to the first light emitting device and the second light emitting device and a bank that defines a first opening portion and a second opening portion respectively corresponding to the first transparent area and the second transparent area, wherein a planar shape of the first opening portion and a planar shape of the second opening portion are square, and an area of the planar shape of the first opening portion and an area of the planar shape of the second opening portion are equal to each other.

In the present embodiments, the first light emitting device and the second light emitting device may each emit a same color.

In the present embodiments, in a plan view, a first distance from a first point of an edge of the first transparent area to an edge of the first opening portion, which is measured in a first direction, may be less than a second distance from a second point of an edge of the second transparent area arranged at a position corresponding to the first point to an edge of the second opening portion, which is measured in the first direction.

In the present embodiments, in a plan view, a first distance from a first point of an edge of the first transparent area to an edge of the first opening portion measured in a first direction may be about 4.9 μm or more and less than about 30 μm.

In the present embodiments, a second distance from a second point of an edge of the second transparent area to an edge of the second opening portion measured in a first direction may be about 5.5 μm or more and about 30 μm or less.

In the present embodiments, at least one of a planar shape of the first transparent area and a planar shape of the second transparent area may be rectangular or square.

According to one or more embodiments, a display apparatus includes a display panel including a plurality of light emitting devices, and a color conversion panel including a color pattern that defines a first transparent area corresponding to one of the plurality of light emitting devices and a bank that defines a first opening portion corresponding to the first transparent area, wherein a planar shape of the first opening portion is octagonal, and in a plan view, a first distance measured from a first side of the planar shape of the first opening portion to an edge of a planar shape of the first transparent area is different from a second distance measured from a second side of the planar shape of the first opening portion to the edge of the planar shape of the first transparent area.

In the present embodiments, the first side and the second side may be arranged to face each other with respect to a center of the first opening portion.

In the present embodiments, the color pattern may define a second transparent area arranged to be adjacent to the first transparent area and corresponding to another of the plurality of light emitting devices and the bank may define a peripheral opening portion arranged around the first transparent area, and the first side may face the second transparent area and the second side may face the peripheral opening portion.

In the present embodiments, the first distance may be less than the second distance.

In the present embodiments, the first distance and the second distance may each be about 4.9 μm or more and less than about 30 μm.

In the present embodiments, the plurality of light emitting devices may each emit a same color.

In the present embodiments, the color pattern may define a second transparent area arranged to be adjacent to the first transparent area and corresponding to another one of the plurality of light emitting devices and a third transparent area arranged to be adjacent to the first transparent area and corresponding to another of the plurality of light emitting devices, and the first side may face the second transparent area and the second side may face the third transparent area.

In the present embodiments, the first distance may be greater than the second distance.

In the present embodiments, the color pattern may include a first color filter arranged in the first transparent area, a second color filter arranged in the second transparent area, and a third color filter arranged in the third transparent area.

According to one or more embodiments, a display apparatus includes a display panel including a first light emitting device, a second light emitting device, and a third light emitting device arranged to be spaced apart from each other, and a color conversion panel including a color pattern that defines a first transparent area, a second transparent area, and a third transparent area respectively corresponding to the first light emitting device, the second light emitting device, and the third light emitting device and a bank that defines a first opening portion, a second opening portion, and a third opening portion respectively corresponding to the first transparent area, the second transparent area, and the third transparent area, wherein the first opening portion and the second opening portion are arranged in a line in a first direction and the third opening portion is arranged to be spaced apart from the first opening portion and the second opening portion in a second direction, and in a plan view, a first width of the first opening portion and a second width of the second opening portion measured in the second direction are equal to each other.

In the present embodiments, a planar shape of at least one of the first opening portion, the second opening portion, and the third opening portion may be square or rectangular.

In the present embodiments, at least one of planar shapes of the first transparent area, the second transparent area, and the third transparent area may be rectangular or square.

In the present embodiments, in a plan view, a first distance from a first point of an edge of the first transparent area to an edge of the first opening portion, which is measured in the second direction, and a second distance from a second point of an edge of the second transparent area arranged at a position corresponding to the first point to an edge of the second opening portion, which is measured in the first direction, may be different from each other.

In the present embodiments, the first distance may be less than the second distance.

In the present embodiments, the first distance may be about 4.9 μm or more and less than about 30 μm.

In the present embodiments, the second distance may be about 5.5 μm or more and about 30 μm or less.

In the present embodiments, the first light emitting device and the second light emitting device may each emit a same color.

In the present embodiments, an area of a planar shape of the first opening portion may be equal to an area of a planar shape of the second opening portion.

In the present embodiments, the first opening portion and the second opening portion may be respectively provided as a plurality of first opening portions and a plurality of second opening portions, and each of the plurality of first opening portions and each of the plurality of second opening portions may be arranged in a line in the second direction and may be arranged to alternate with each other in the first direction.

Other aspects and features, other than those described above, of embodiments of the present disclosure will become apparent from the accompanying drawings, the appended claims, and the detailed description of the disclosure.

These general and particular aspects of embodiments of the present disclosure may be implemented by using systems, methods, computer programs, or any combinations of systems, methods, and computer programs.

BRIEF DESCRIPTION OF THE DRAWINGS

The above and other aspects and features of certain embodiments of the disclosure will be more apparent from the following description taken in conjunction with the accompanying drawings, in which:

FIG. 8A is a plan view illustrating a method of manufacturing a display apparatus according to an embodiment;

DETAILED DESCRIPTION

Figure 1:
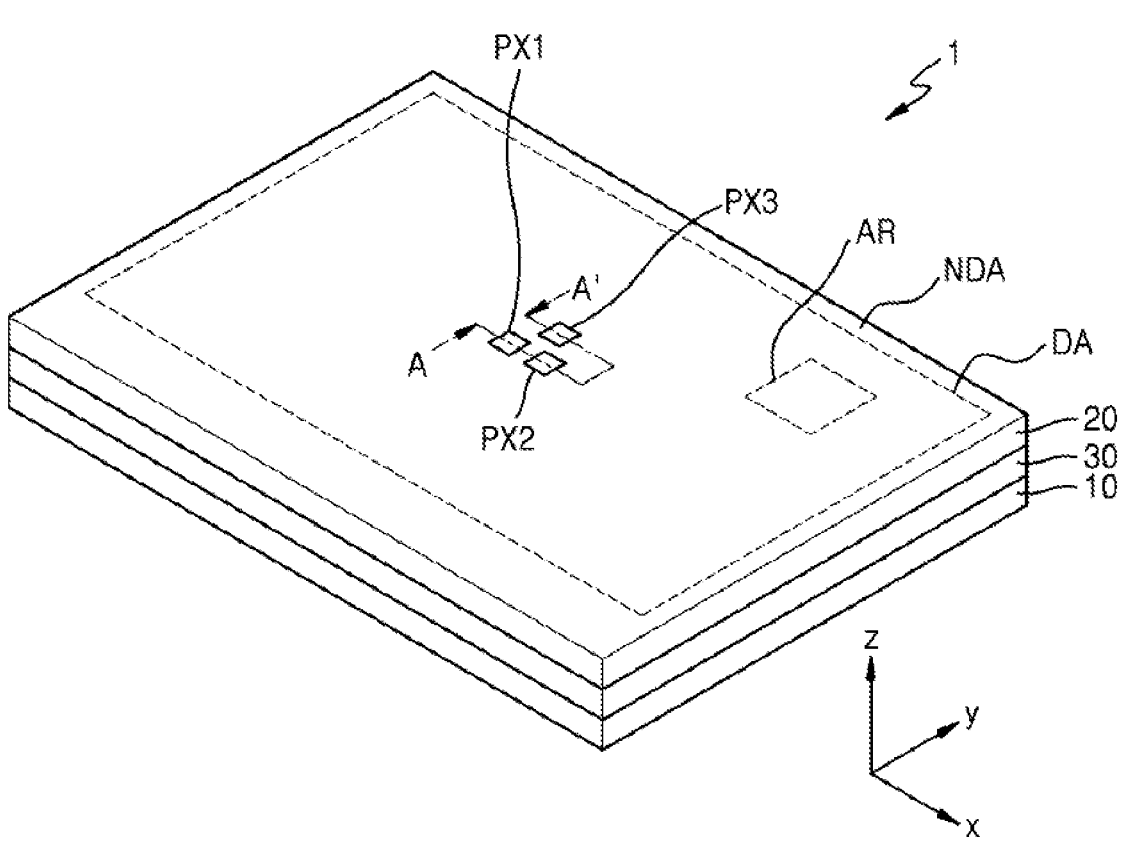
FIG. 1 is a perspective view schematically illustrating a display apparatus according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The subject matter of the disclosure may include various embodiments and modifications, and certain embodiments thereof are illustrated in the drawings and will be described herein in more detail. The effects and features of the disclosure and the accomplishing methods thereof will become apparent from the embodiments described below in more detail with reference to the accompanying drawings. However, the subject matter of the present disclosure is not limited to the embodiments described below and may be embodied in various suitable modes.

Hereinafter, embodiments will be described in more detail with reference to the accompanying drawings, and in the following description, like reference numerals will denote like elements and redundant descriptions thereof will not be repeated for conciseness.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

Also, it will be understood that the terms "comprise," "include," and "have," as used herein, specify the presence of stated features or elements, but do not preclude the presence or addition of one or more other features or elements.

It will be understood that when a layer, region, area, component, or element is referred to as being "on" another layer, region, area, component, or element, it may be "directly on" the other layer, region, area, component, or element or may be "indirectly on" the other layer, region, area, component, or element with one or more intervening layers, regions, areas, components, or elements therebetween.

Sizes of elements in the drawings may be exaggerated for convenience of description. In other words, because the sizes and thicknesses of elements in the drawings may be arbitrarily illustrated for convenience of description, the disclosure is not limited thereto.

Also, herein, the x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

When a certain embodiment may be implemented differently, a particular process order may be performed differently from the described order. For example, two consecutively described processes may be performed substantially at the same time or may be performed in an order opposite to the described order.

FIG. 1 is a perspective view schematically illustrating a display apparatus according to an embodiment.

Referring to FIG. 1, a display apparatus 1 may display an image. The display apparatus 1 may provide an image through a plurality of subpixels arranged in a display area DA. Each of the subpixels of the display apparatus 1 may be an area capable of emitting light of a set or certain color. The display apparatus 1 may display an image by using light emitted from a plurality of subpixels. For example, the subpixel may emit red, green, or blue light. As another example, the subpixel may emit red, green, blue, or white light.

A non-display area NDA may at least partially surround the display area DA. In an embodiment, the non-display area NDA may entirely surround the display area DA. The non-display area NDA may be an area that does not provide an image (or is not designed to provide an image).

The display area DA may have a polygonal shape including a tetragonal shape as illustrated in FIG. 1. For example, the display area DA may have a rectangular shape in which the horizontal length is greater than the vertical length, may have a rectangular shape in which the horizontal length is less than the vertical length, or may have a square shape. In some embodiments, the display area DA may have various suitable shapes such as elliptical shapes or circular shapes. In an embodiment, the display apparatus 1 may include a display panel 10, a color conversion panel 20, and a filling layer 30. The display panel 10, the filling layer 30, and the color conversion panel 20 may be stacked in a thickness direction (e.g., z direction).

The display apparatus 1 having the above structure may be included in a mobile phone, a television, a billboard, a monitor, a tablet PC, a notebook computer, and/or the like.

Figure 2:
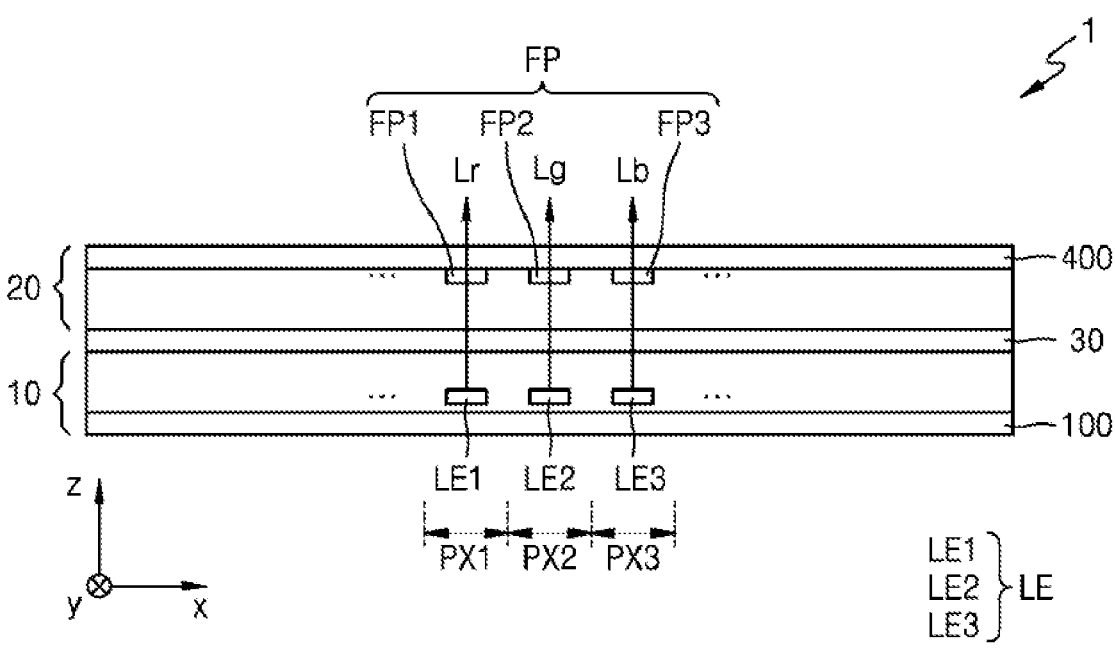
FIG. 2 is a cross-sectional view schematically illustrating a display apparatus according to an embodiment.

FIG. 2 is a cross-sectional view schematically illustrating a display apparatus according to an embodiment.

Referring to FIG. 2, a display apparatus 1 may include a first subpixel PX1, a second subpixel PX2, and a third subpixel PX3. The first subpixel PX1, the second subpixel PX2, and the third subpixel PX3 may be subpixels emitting light of different colors. For example, the first subpixel PX1 may emit red light Lr, the second subpixel PX2 may emit green light Lg, and the third subpixel PX3 may emit blue light Lb.

At least one of the first subpixel PX1, the second subpixel PX2, and the third subpixel PX3 described above may be provided as a plurality, but the present disclosure is not limited thereto. Hereinafter, for convenience of description, a case where each of the first subpixel PX1, the second subpixel PX2, and the third subpixel PX3 is provided as a plurality will be mainly described.

The display apparatus 1 may include a display panel 10, a color conversion panel 20, and a filling layer 30. The display panel 10 may include a lower substrate 100 and a light emitting device LE. The light emitting device LE may be, for example, an organic light emitting diode. In an embodiment, each of the first subpixel PX1, the second subpixel PX2, and the third subpixel PX3 may include a light emitting device LE. For example, the first subpixel PX1 may include a first light emitting device LE1. The first light emitting device LE1 may be a first organic light emitting diode. The second subpixel PX2 may include a second light emitting device LE2. The second light emitting device LE2 may be a second organic light emitting diode. The third subpixel PX3 may include a third light emitting device LE3. The third light emitting device LE3 may be a third organic light emitting diode.

The first light emitting device LE1, the second light emitting device LE2, and the third light emitting device LE3 may each emit light of the same color. In an embodiment, the first light emitting device LE1, the second light emitting device LE2, and the third light emitting device LE3 may each emit blue light.

The color conversion panel 20 may include an upper substrate 400 and a filter unit FP. In an embodiment, the filter unit FP may include a first filter unit FP1, a second filter unit FP2, and a third filter unit FP3. The light emitted from the first light emitting device LE1 may be emitted as red light Lr through the first filter unit FP1. The light emitted from the second light emitting device LE2 may be emitted as green light Lg through the second filter unit FP2. The light emitted from the third light emitting device LE3 may be emitted as blue light Lb through the third filter unit FP3.

The filter unit FP may include a functional layer and a color filter layer. In an embodiment, the functional layer may include a first quantum dot layer, a second quantum dot layer, and a transmission layer. In an embodiment, the color filter layer may include a first color filter, a second color filter, and a third color filter. The first filter unit FP1 may include a first quantum dot layer and a first color filter. The second filter unit FP2 may include a second quantum dot layer and a second color filter. The third filter unit FP3 may include a transmission layer and a third color filter.

The filter unit FP may be located directly on the upper substrate 400. In this case, "located directly on the upper substrate" may mean that the color conversion panel 20 is manufactured by forming the first color filter, the second color filter, and the third color filter directly on the upper substrate 400. For example, the filter unit FP may physically contact the upper substrate 400. Thereafter, the color conversion panel 20 may be bonded to the display panel 10 such that the first filter unit FP1, the second filter unit FP2, and the third filter unit FP3 may respectively face the first light emitting device LE1, the second light emitting device LE2, and the third light emitting device LE3.

The filling layer 30 may be arranged between the display panel 10 and the color conversion panel 20. The filling layer 30 may bond the display panel 10 and the color conversion panel 20 to each other. In an embodiment, the filling layer 30 may include a thermocurable and/or photocurable filler. In some embodiments, any one of the display panel 10 and the color conversion panel 20 may include a column spacer. For example, the display panel 10 may include a column spacer protruding toward the color conversion panel 20. As another example, the color conversion panel 20 may include a column spacer protruding toward the display panel 10. Thus, a plurality of light emitting devices LE and a plurality of filter units FP may each maintain a set or certain distance therebetween, and the display apparatus 1 may maintain uniform (e.g., substantially uniform) luminance according to positions.

Figure 3A:
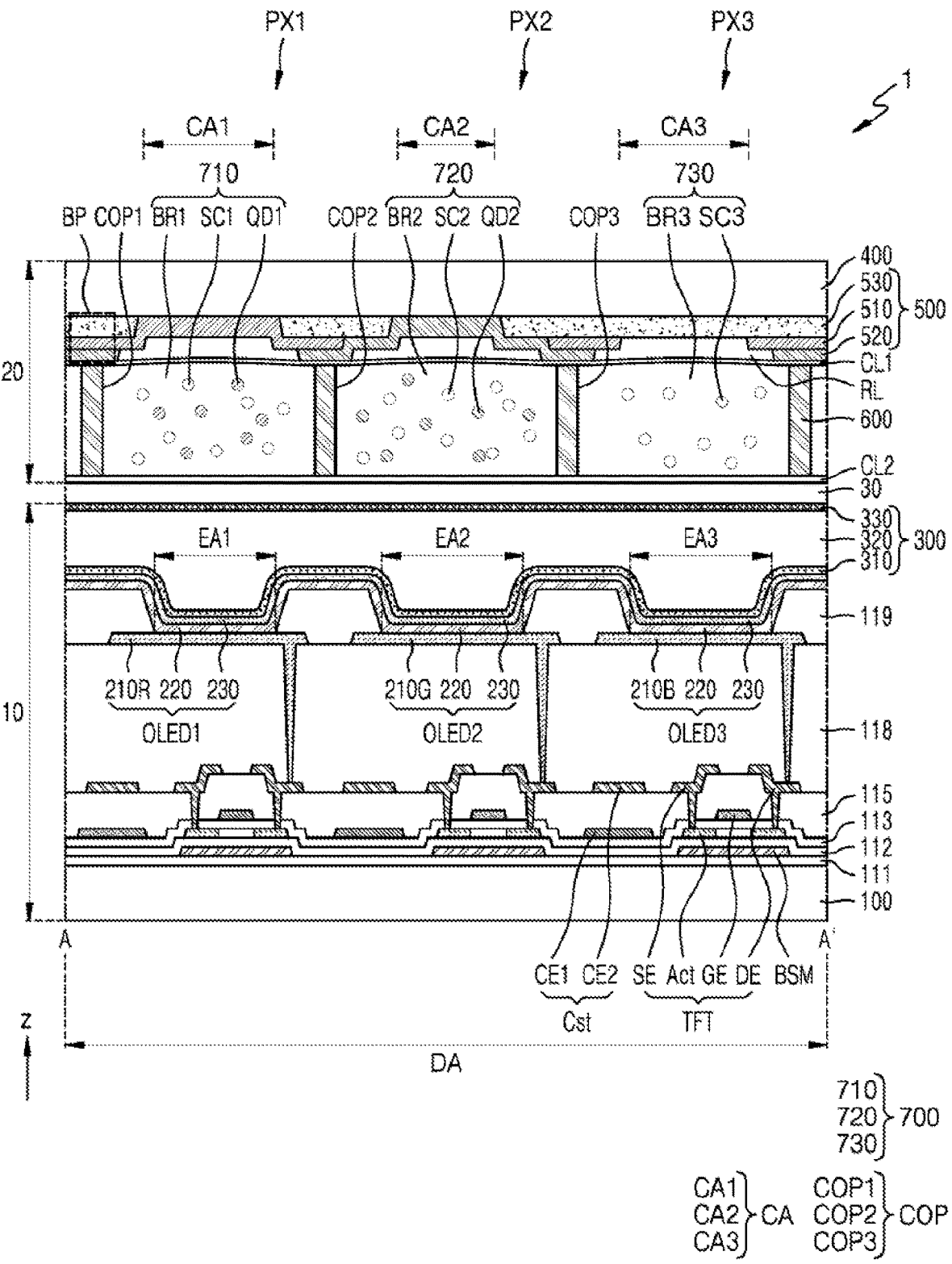
FIGS. 3A and 3B are cross-sectional views schematically illustrating a display apparatus according to an embodiment.
Figure 3B:
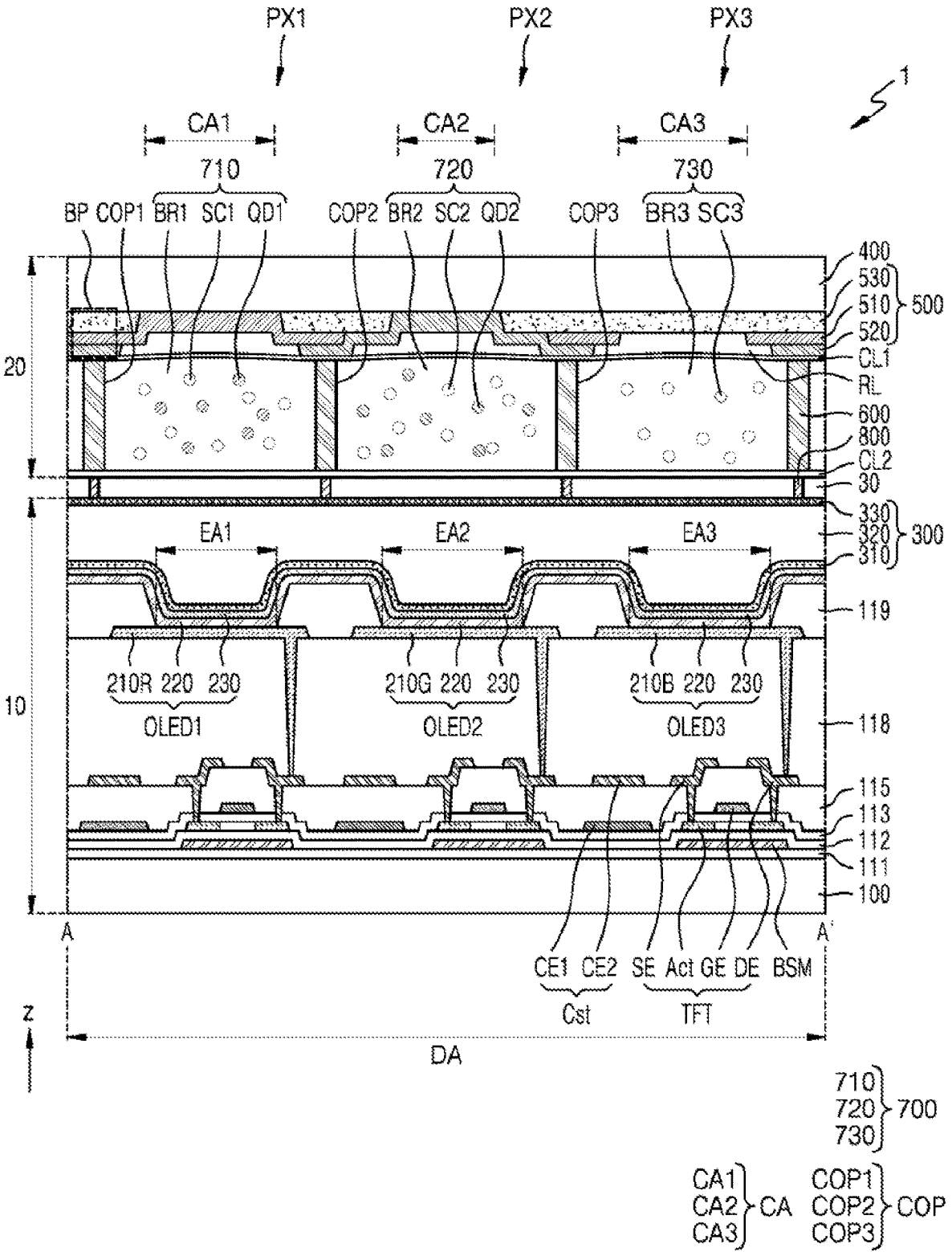

FIGS. 3A and 3B are cross-sectional views schematically illustrating a display apparatus according to an embodiment. FIGS. 3A and 3B are cross-sectional views of the display apparatus 1 taken along line A-A' of FIG. 1.

Referring to FIG. 3A, the display apparatus 1 may include a first subpixel PX1, a second subpixel PX2, and a third subpixel PX3 arranged in the display area DA. The first subpixel PX1, the second subpixel PX2, and the third subpixel PX3 may implement light of different colors. For example, the first subpixel PX1 may implement red light, the second subpixel PX2 may implement green light, and the third subpixel PX3 may implement blue light.

In other embodiments, the display apparatus 1 may include more subpixels. FIGS. 3A and 3B illustrate that the first subpixel PX1, the second subpixel PX2, and the third subpixel PX3 are adjacent to each other; however, in other embodiments, the first subpixel PX1, the second subpixel PX2, and the third subpixel PX3 may not be adjacent to each other.

The display apparatus 1 may include a display panel 10, a color conversion panel 20, and a filling layer 30. The display panel 10 may include a lower substrate 100 and a light emitting device over the lower substrate 100 and including an intermediate layer 220. The light emitting device may be an organic light emitting diode. In an embodiment, the display panel 10 may include a first organic light emitting diode OLED1, a second organic light emitting diode OLED2, and a third organic light emitting diode OLED3 over the lower substrate 100. The first organic light emitting diode OLED1, the second organic light emitting diode OLED2, and the third organic light emitting diode OLED3 may include an intermediate layer 220.

Hereinafter, a stack structure of the display panel 10 will be described in more detail. In an embodiment, the display panel 10 may include a lower substrate 100, a first buffer layer 111, a bias electrode BSM, a second buffer layer 112, a thin film transistor TFT, a storage capacitor Cst, a gate insulating layer 113, an interlayer insulating layer 115, a planarization layer 118, a light emitting device, and an encapsulation layer 300. The thin film transistor TFT may include a semiconductor layer Act, a gate electrode GE, a source electrode SE, and a drain electrode DE. The storage capacitor Cst may include a first electrode CE1 and a second electrode CE2.

The lower substrate 100 may include a glass material, a ceramic material, a metal material, and/or a flexible or bendable material. When the lower substrate 100 is flexible or bendable, the lower substrate 100 may include a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. The lower substrate 100 may have a single-layer or multiple-layer structure of the above material and may further include an inorganic layer in the case of having a multiple-layer structure. In an embodiment, the lower substrate 100 may have an organic/inorganic/organic structure.

A barrier layer may be further included between the lower substrate 100 and the first buffer layer 111. The barrier layer may prevent, minimize, or reduce the penetration of impurities from the lower substrate 100 and/or the like into the semiconductor layer Act. The barrier layer may include an inorganic material such as oxide and/or nitride, an organic material, or an organic/inorganic composite and may include a single-layer or multiple-layer structure of an inorganic material and an organic material.

The bias electrode BSM may be over the first buffer layer 111 to correspond to the thin film transistor TFT. In an embodiment, a voltage may be applied to the bias electrode BSM. Also, the bias electrode BSM may prevent external light from reaching the semiconductor layer Act (or reduce an amount of external light incident on the semiconductor layer Act). Accordingly, the characteristics of the thin film transistor TFT may be stabilized. The bias electrode BSM may be omitted in some embodiments.

The semiconductor layer Act may be over the second buffer layer 112. The semiconductor layer Act may include amorphous silicon or may include polysilicon. In other embodiments, the semiconductor layer Act may include an oxide of at least one of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). In some embodiments, the semiconductor layer Act may include a Zn oxide-based material such as a Zn oxide, an In—Zn oxide, and/or a Ga—In—Zn oxide. In other embodiments, the semiconductor layer Act may include an IGZO (In—Ga—Zn—O), ITZO (In—Sn—Zn—O), and/or IGTZO (In—Ga—Sn—Zn—O) semiconductor containing a metal such as indium (In), gallium (Ga), and/or tin (Sn) in ZnO. The semiconductor layer Act may include a channel area and a source area and a drain area arranged on both sides of the channel area. The semiconductor layer Act may include a single layer or multiple layers.

The gate electrode GE may be over the semiconductor layer Act with the gate insulating layer 113 therebetween. The gate electrode GE may at least partially overlap the semiconductor layer Act. The gate electrode GE may include molybdenum (Mo), aluminum (Al), copper (Cu), titanium (Ti), and/or the like and may include a single layer or multiple layers. For example, the gate electrode GE may include a single layer of Mo. The first electrode CE1 of the storage capacitor Cst may be arranged on the same layer as the gate electrode GE. The first electrode CE1 may include the same material as the gate electrode GE.

Although FIGS. 3A and 3B illustrate that the gate electrode GE of the thin film transistor TFT and the first electrode CE1 of the storage capacitor Cst are separately arranged, the storage capacitor Cst may overlap the thin film transistor TFT. In this case, the gate electrode GE of the thin film transistor TFT may function as the first electrode CE1 of the storage capacitor Cst.

The interlayer insulating layer 115 may cover the gate electrode GE and the first electrode CE1 of the storage capacitor Cst. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and/or zinc oxide ($ZnO_x$). The zinc oxide ($ZnO_x$) may include zinc oxide (ZnO) and/or zinc peroxide ($ZnO_2$).

The second electrode CE2 of the storage capacitor Cst, the source electrode SE, and the drain electrode DE may be over the interlayer insulating layer 115. The second electrode CE2 of the storage capacitor Cst, the source electrode SE, and the drain electrode DE may include a conductive material including molybdenum (Mo), aluminum (Al), copper (Cu), titanium (Ti), and/or the like and may include a single layer or multiple layers including the above material. For example, the second electrode CE2, the source electrode SE, and the drain electrode DE may include a multilayer structure of Ti/Al/Ti. The source electrode SE and the drain electrode DE may be connected to the source area or the drain area of the semiconductor layer Act through a contact hole.

The second electrode CE2 of the storage capacitor Cst may overlap the first electrode CE1 with the interlayer insulating layer 115 therebetween and may constitute the storage capacitor Cst. In this case, the interlayer insulating layer 115 may function as a dielectric layer of the storage capacitor Cst.

The planarization layer 118 may be over the second electrode CE2 of the storage capacitor Cst, the source electrode SE, and the drain electrode DE. The planarization layer 118 may include a single layer or multiple layers including an organic material and may provide a flat upper surface. The planarization layer 118 may include, for example, a general-purpose polymer such as benzocyclobutene (BCB), polyimide, hexamethyldisiloxane (HMDSO), polymethylmethacrylate (PMMA), and/or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and/or any blend thereof.

The light emitting device may be over the planarization layer 118. The light emitting device may include a pixel electrode, an intermediate layer 220, and an opposite electrode 230. In an embodiment, the first organic light emitting diode OLED1, the second organic light emitting diode OLED2, and the third organic light emitting diode OLED3 may be over the planarization layer 118. The first organic light emitting diode OLED1, the second organic light emitting diode OLED2, and the third organic light emitting diode OLED3 may respectively include a first subpixel electrode 210R, a second subpixel electrode 210G, and a third subpixel electrode 210B. In an embodiment, the first organic light emitting diode OLED1, the second organic light emitting diode OLED2, and the third organic light emitting diode OLED3 may include the intermediate layer 220 and the opposite electrode 230 in common.

The first subpixel electrode 210R, the second subpixel electrode 210G, and the third subpixel electrode 210B may be over the planarization layer 118. Each of the first subpixel electrode 210R, the second subpixel electrode 210G, and the third subpixel electrode 2108 may be connected to the thin film transistor TFT. The first subpixel electrode 210R, the second subpixel electrode 210G, and the third subpixel electrode 2108 may be a (semi)transparent electrode or a reflective electrode. In some embodiments, the first subpixel electrode 210R, the second subpixel electrode 210G, and the third subpixel electrode 2108 may include a reflective layer formed of Ag, Mg, Al, Pt, Pd, Au, Ni, Nd, Ir, Cr, and/or any suitable compound thereof and a transparent or semitransparent electrode layer formed on the reflective layer. The transparent or semitransparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the first subpixel electrode 210R, the second subpixel electrode 210G, and the third subpixel electrode 2108 may include a three-layer structure of ITO/Ag/ITO.

A pixel definition layer 119 may be over the planarization layer 118. The pixel definition layer 119 may include opening portions respectively exposing center portions of the first subpixel electrode 210R, the second subpixel electrode 210G, and the third subpixel electrode 2108. The pixel definition layer 119 may cover each of the edges of the first subpixel electrode 210R, the second subpixel electrode 210G, and the third subpixel electrode 2108. The pixel definition layer 119 may prevent or reduce an occurrence of an arc and/or the like at the edge of the first subpixel electrode 210R, the second subpixel electrode 210G, and the third subpixel electrode 2108 by increasing the distance between the edge of the first subpixel electrode 210R, the second subpixel electrode 210G, and the third subpixel electrode 210B and the opposite electrode 230 over the first subpixel electrode 210R, the second subpixel electrode 210G, and the third subpixel electrode 210B. The pixel definition layer 119 may be formed of one or more organic insulating materials among polyimide, polyamide, acrylic resin, benzocyclobutene, and phenol resin by spin coating and/or the like.

The intermediate layer 220 of the first organic light emitting diode OLED1, the second organic light emitting diode OLED2, and the third organic light emitting diode OLED3 may include an emission layer as an organic material including a fluorescent or phosphorescent material that emits red, green, blue, or white light. In addition to various suitable organic materials, the intermediate layer 220 may further include a metal-containing compound such as an organometallic compound, and/or an inorganic material such as a quantum dot. The intermediate layer 220 may include a low molecular weight organic material and/or a high molecular weight organic material, and functional layers such as a hole transport layer (HTL), a hole injection layer (HIL), an electron transport layer (ETL), and/or an electron injection layer (EIL) may optionally be further under and over the emission layer of the intermediate layer 220. FIGS. 3A and 3B illustrate that the intermediate layer 220 is integrally provided over the first subpixel electrode 210R, the second subpixel electrode 210G, and the third subpixel electrode 210B; however, the disclosure is not limited thereto and the intermediate layer 220 may be variously modified such as being arranged corresponding to each of the first subpixel electrode 210R, the second subpixel electrode 210G, and the third subpixel electrode 210B. For example, respective intermediate layers 220 of OLED1, OLED2, and OLED3 may be spaced apart from each other such that the respective intermediate layers 220 do not physically contact each other.

The intermediate layer 220 may include an integral layer over the first subpixel electrode 210R, the second subpixel electrode 210G, and the third subpixel electrode 210B as described above or may include a layer patterned to correspond to each of the first subpixel electrode 210R, the second subpixel electrode 210G, and the third subpixel electrode 2108 when necessary or desired. In any case, the intermediate layer 220 may include a first color emission layer. The first color emission layer may be integral over the first subpixel electrode 210R, the second subpixel electrode 210G, and the third subpixel electrode 210B or may be patterned to correspond to each of the first subpixel electrode 210R, the second subpixel electrode 210G, and the third subpixel electrode 2108 when necessary or desired. The first color emission layer may emit light of a first wavelength band, for example, light having a wavelength of about 450 nm to about 495 nm.

The opposite electrode 230 may be over the intermediate layer 220 to correspond to the first subpixel electrode 210R, the second subpixel electrode 210G, and the third subpixel electrode 210B. For example, respective opposite electrodes 230 of OLED1, OLED2, and OLED3 may be spaced apart from each other such that the respective opposite electrodes 230 do not physically contact each other. In some embodiments, the opposite electrode 230 may be integrally provided in a plurality of organic light emitting diodes. In some embodiments, the opposite electrode 230 may be a transparent or semitransparent electrode and may include a thin metal layer having a low work function and including Li, Ca, LiF/Ca, LiF/Al, Al, Ag, Mg, and/or any suitable compound thereof. Also, a transparent conductive oxide (TCO) layer such as ITO, IZO, ZnO, and/or $In_2O_3$ may be further over the thin metal layer.

In an embodiment, a first light may be generated in a first emission area EA1 of the first organic light emitting diode OLED1 and emitted to the outside. The first emission area EA1 may be defined as a portion of the first subpixel electrode 210R exposed by an opening portion of the pixel definition layer 119. A second light may be generated in a second emission area EA2 of the second organic light emitting diode OLED2 and emitted to the outside. The second emission area EA2 may be defined as a portion of the second subpixel electrode 210G exposed by an opening portion of the pixel definition layer 119. A third light may be generated in a third emission area EA3 of the third organic light emitting diode OLED3 and emitted to the outside. The third emission area EA3 may be defined as a portion of the third subpixel electrode 210B exposed by an opening portion of the pixel definition layer 119.

The first emission area EA1, the second emission area EA2, and the third emission area EA3 may be spaced apart from each other. An area other than the first emission area EA1, the second emission area EA2, and the third emission area EA3 in the display area DA may be a non-emission area. The first emission area EA1, the second emission area EA2, and the third emission area EA3 may be divided by the non-emission area. In the plan view, the first emission area EA1, the second emission area EA2, and the third emission area EA3 may be arranged in various suitable arrangements such as stripe arrangements or a PENTILE® arrangement structure (e.g., an RGBG matrix, RGBG structure, or RGBG matrix structure), but the present disclosure is not limited thereto. PENTILE® is a duly registered trademark of Samsung Display Co., Ltd. In the plan view, each of the shape of the first emission area EA1, the shape of the second emission area EA2, and the shape of the third emission area EA3 may be any one of polygonal, circular, and elliptical shapes.

A spacer may be further included over the pixel definition layer 119 to prevent or reduce mask marking. The spacer may be integrally provided with the pixel definition layer 119. For example, the spacer and the pixel definition layer 119 may be concurrently (e.g., simultaneously) formed in the same process by using a halftone mask process.

The encapsulation layer 300 may be over a display device and may cover the display device. Because the first organic light emitting diode OLED1, the second organic light emitting diode OLED2, and the third organic light emitting diode OLED3 may be easily damaged by external moisture and/or oxygen, they may be covered and protected by the encapsulation layer 300. The encapsulation layer 300 may cover the display area DA and may extend to the outside of the display area DA. The encapsulation layer 300 may include at least one organic encapsulation layer and at least one inorganic encapsulation layer. For example, the encapsulation layer 300 may include a first inorganic encapsulation layer 310, an organic encapsulation layer 320, and a second inorganic encapsulation layer 330.

Because the first inorganic encapsulation layer 310 extends along the structure thereunder, the upper surface thereof may not be flat. The organic encapsulation layer 320 may cover the first inorganic encapsulation layer 310 and may have a substantially flat upper surface unlike the first inorganic encapsulation layer 310.

The first inorganic encapsulation layer 310 and the second inorganic encapsulation layer 330 may include one or more inorganic materials among aluminum oxide ($Al_2O_3$), titanium oxide ($TiO_2$), tantalum oxide ($Ta_2O_5$), hafnium oxide ($HfO_2$), zinc oxide ($ZnO_x$), silicon oxide ($SiO_2$), silicon nitride ($SiN_x$), and silicon oxynitride (SiON). The organic encapsulation layer 320 may include a polymer-based material. The polymer-based material may include acryl-based resin, epoxy-based resin, polyimide, polyethylene, and/or the like. In an embodiment, the organic encapsulation layer 320 may include acrylate.

Although the encapsulation layer 300 may crack through the above multilayer structure, the crack may not be connected between the first inorganic encapsulation layer 310 and the organic encapsulation layer 320 or between the organic encapsulation layer 320 and the second inorganic encapsulation layer 330. Accordingly, the formation of a path through which external moisture and/or oxygen and/or the like penetrates into the display area DA may be prevented, minimized, or reduced. In some embodiments, when necessary or desired, other layers such as a capping layer may be arranged between the first inorganic encapsulation layer 310 and the opposite electrode 230.

The color conversion panel 20 may include an upper substrate 400, a color filter layer 500, a refractive layer RL, a first capping layer CL1, a bank 600, a functional layer 700, and a second capping layer CL2. The upper substrate 400 may be over the lower substrate 100 such that the light emitting device may be arranged therebetween. The upper substrate 400 may be over the first organic light emitting diode OLED1, the second organic light emitting diode OLED2, and the third organic light emitting diode OLED3.

The upper substrate 400 may include a transparent area CA overlapping the light emitting device. In an embodiment, the transparent area CA may include a first transparent area CA1, a second transparent area CA2, and a third transparent area CA3. In the plan view, the first emission area CA1 may overlap the first organic light emitting diode OLED1 and/or the first emission area EA1. In the plan view, the second emission area CA2 may overlap the second organic light emitting diode OLED2 and/or the second emission area EA2. In the plan view, the third emission area CA3 may overlap the third organic light emitting diode OLED3 and/or the third emission area EA3.

The transparent area CA described above may be defined as a color filter. For example, the transparent area CA may refer to an area in which only one color filter is arranged. As an embodiment, only a first color filter 510 may be arranged in the first transparent area CA1. Also, only a second color filter 520 may be arranged in the second transparent area CA2. Only a third color filter 530 may be arranged in the third transparent area CA3. In this case, the first transparent area CA1 and the second transparent area CA2 may be defined by the third color filter 530. In some embodiments, the first transparent area CA1 and the second transparent area CA2 may be defined as a pattern area that is an open portion of the third color filter 530.

The upper substrate 400 may include glass, metal, and/or polymer resin. When the upper substrate 400 is flexible or bendable, the upper substrate 400 may include, for example, a polymer resin such as polyethersulfone, polyacrylate, polyetherimide, polyethylene naphthalate, polyethylene terephthalate, polyphenylene sulfide, polyarylate, polyimide, polycarbonate, and/or cellulose acetate propionate. In an embodiment, the upper substrate 400 may have a multilayer structure including two layers each including such a polymer resin and a barrier layer arranged between the layers and including an inorganic material such as silicon oxide ($SiO_2$), silicon nitride ($SiN_x$), and/or silicon oxynitride (SiON).

The color filter layer 500 may be arranged on the lower surface of the upper substrate 400 in the direction from the upper substrate 400 to the lower substrate 100. The color filter layer 500 may include a first color filter 510, a second color filter 520, and a third color filter 530. The first color filter 510 may be over the first transparent area CA1. The second color filter 520 may be over the second transparent area CA2. The third color filter 530 may be over the third transparent area CA3. The first color filter 510, the second color filter 520, and the third color filter 530 may include a photosensitive resin material. Each of the first color filter 510, the second color filter 520, and the third color filter 530 may include a dye representing a set or unique color. The first color filter 510 may pass only light having a wavelength of about 630 nm to about 780 nm, the second color filter 520 may pass only light having with a wavelength of about 495 nm to about 570 nm, and the third color filter 530 may pass only light having a wavelength of about 450 nm to about 495 nm.

The color filter layer 500 may reduce the reflection of external light by the display apparatus 1. For example, when external light reaches the first color filter 510, only light of a preset wavelength described above may pass through the first color filter 510, and light of other wavelengths may be absorbed by the first color filter 510. Thus, only light of a preset wavelength among the external light incident on the display apparatus 1 may pass through the first color filter 510, and a portion of the light having passed therethrough may be reflected by the opposite electrode 230 and/or the first subpixel electrode 210R thereunder and emitted back to the outside. Because only a portion of the external light incident on a position where the first subpixel PX1 is located may be reflected to the outside, the reflection of the external light may be reduced. This description may also be applied to the second color filter 520 and the third color filter 530.

The first color filter 510, the second color filter 520, and the third color filter 530 may overlap each other. The first color filter 510, the second color filter 520, and the third color filter 530 may overlap each other between one of the transparent areas CA and another of the transparent areas CA. For example, the first color filter 510, the second color filter 520, and the third color filter 530 may overlap each other between the first transparent area CA1 and the second transparent area CA2. In this case, the third color filter 530 may be arranged between the first transparent area CA1 and the second transparent area CA2. The first color filter 510 may extend from the first transparent area CA1 to overlap the third color filter 530. The second color filter 520 may extend from the second transparent area CA2 to overlap the third color filter 530.

The first color filter 510, the second color filter 520, and the third color filter 530 may overlap each other between the second transparent area CA2 and the third transparent area CA3. The first color filter 510 may be arranged between the second transparent area CA2 and the third transparent area CA3. The second color filter 520 may extend from the second transparent area CA2 to overlap the first color filter 510. The third color filter 530 may extend from the third transparent area CA3 to overlap the first color filter 510.

The first color filter 510, the second color filter 520, and the third color filter 530 may overlap each other between the third transparent area CA3 and the first transparent area CA1. The second color filter 520 may be arranged between the third transparent area CA3 and the first transparent area CA1. The third color filter 530 may extend from the third transparent area CA3 to overlap the second color filter 520. The first color filter 510 may extend from the first transparent area CA1 to overlap the second color filter 520.

The first color filter 510, the second color filter 520, and the third color filter 530 may overlap each other to form a light blocking unit BP. Thus, the color filter layer 500 may prevent or reduce color mixing without a separate light blocking member.

In an embodiment, the third color filter 530 may be first stacked over the upper substrate 400. In this case, the third color filter 530 may partially absorb the external light incident from the outside of the upper substrate 400 to reduce the reflectance of the display apparatus 1, and the light reflected by the third color filter 530 may be hardly recognized or perceived by the user.

The refractive layer RL may be arranged in the transparent area CA. The refractive layer RL may be arranged in each of the first transparent area CA1, the second transparent area CA2, and the third transparent area CA3. The refractive layer RL may include an organic material. In an embodiment, the refractive index of the refractive layer RL may be less than the refractive index of the first capping layer CL1. In an embodiment, the refractive index of the refractive layer RL may be less than the refractive index of the color filter layer 500. Thus, the refractive layer RL may condense light.

The first capping layer CL1 may be over the refractive layer RL and the color filter layer 500. In an embodiment, the first capping layer CL1 may be arranged between the color filter layer 500 and the functional layer 700. The first capping layer CL1 may protect the refractive layer RL and the color filter layer 500. The first capping layer CL1 may prevent or reduce penetration of impurities such as moisture and/or air from the outside to damage and/or contaminate the refractive layer RL and/or the color filter layer 500. The first capping layer CL1 may include an inorganic material.

The bank 600 may be over the first capping layer CL1. In an embodiment, the bank 600 may be over the upper substrate 400. The bank 600 may be arranged on the lower surface of the upper substrate 400 facing the lower substrate 100. The bank 600 may include an organic material. In some cases, the bank 600 may include a light blocking material to function as a light blocking layer. The light blocking material may include, for example, at least one of black pigments, black dyes, black particles, and metal particles.

The bank 600 may include a plurality of opening portions. For example, the bank 600 may include an opening portion COP. The opening portion COP may overlap the transparent area CA. In an embodiment, a plurality of opening portions COP may overlap the transparent area CA. For example, a first opening portion COP1 may overlap the first transparent area CA1. A second opening portion COP2 may overlap the second transparent area CA2. A third opening portion COP3 may overlap the third transparent area CA3.

The functional layer 700 may be arranged in the opening portion COP. The functional layer 700 may fill the opening portion COP. In an embodiment, the functional layer 700 may include at least one of a color conversion material and a scatterer (e.g., a light scatterer). In an embodiment, the color conversion material may include a quantum dot. In an embodiment, the functional layer 700 may include a first quantum dot layer 710, a second quantum dot layer 720, and a transmission layer 730.

The first quantum dot layer 710 may be arranged in the first opening portion COP1. The first quantum dot layer 710 may overlap the first transparent area CA1. The first quantum dot layer 710 may fill the first opening portion COP1. The first quantum dot layer 710 may overlap the first emission area EA1. The first subpixel PX1 may include the first organic light emitting diode OLED1 and the first quantum dot layer 710.

The first quantum dot layer 710 may convert light of a first wavelength band generated in the intermediate layer 220 over the first subpixel electrode 210R into light of a second wavelength band. For example, when light having a wavelength of about 450 nm to about 495 nm is generated in the intermediate layer 220 over the first subpixel electrode 210R, the first quantum dot layer 710 may convert the light into light having a wavelength of about 630 nm to about 780 nm. Thus, in the first subpixel PX1, light having a wavelength of about 630 nm to about 780 nm may be emitted to the outside through the upper substrate 400. In an embodiment, the first quantum dot layer 710 may include a first quantum dot QD1, a first scatterer SC1, and a first base resin BR1. The first quantum dot QD1 and the first scatterer SC1 may be dispersed in the first base resin BR1.

The second quantum dot layer 720 may be arranged in the second opening portion COP2. The second quantum dot layer 720 may overlap the second transparent area CA2. The second quantum dot layer 720 may fill the second opening portion COP2. The second quantum dot layer 720 may overlap the second emission area EA2. The second subpixel PX2 may include the second organic light emitting diode OLED2 and the second quantum dot layer 720.

The second quantum dot layer 720 may convert light of a first wavelength band generated in the intermediate layer 220 over the second subpixel electrode 210G into light of a third wavelength band. For example, when light having a wavelength of about 450 nm to about 495 nm is generated in the intermediate layer 220 over the second subpixel electrode 210G, the second quantum dot layer 720 may convert the light into light having a wavelength of about 495 nm to about 570 nm. Thus, in the second subpixel PX2, light having a wavelength of about 495 nm to about 570 nm may be emitted to the outside through the upper substrate 400. In an embodiment, the second quantum dot layer 720 may include a second quantum dot QD2, a second scatterer SC2, and a second base resin BR2. The second quantum dot QD2 and the second scatterer SC2 may be dispersed in the second base resin BR2.

The transmission layer 730 may be arranged in the third opening portion COP3. The transmission layer 730 may overlap the third transparent area CA3. The transmission layer 730 may fill the third opening portion COP3. The transmission layer 730 may overlap the third emission area EA3. The third subpixel PX3 may include the third organic light emitting diode OLED3 and the transmission layer 730.

The transmission layer 730 may emit the light generated in the intermediate layer 220 over the third subpixel electrode 210B to the outside without wavelength conversion. For example, when light having a wavelength of about 450 nm to about 495 nm is generated in the intermediate layer 220 over the third subpixel electrode 210B, the transmission layer 730 may emit the light to the outside without wavelength conversion. In an embodiment, the transmission layer 730 may include a third scatterer SC3 and a third base resin BR3. The third scatterer SC3 may be dispersed in the third base resin BR3. In an embodiment, the transmission layer 730 may not include a quantum dot.

At least one of the first quantum dot QD1 and the second quantum dot QD2 may include a semiconductor material such as cadmium sulfide (CdS), cadmium telleride (CdTe), zinc sulfide (ZnS), and/or indium phosphide (InP). The size of the quantum dot may be several nanometers, and the wavelength of light after conversion may vary according to the size of the quantum dot.

In an embodiment, the core of the quantum dot may be selected among a Group II-VI compound, a Group III-V compound, a Group IV-VI compound, a group IV element, a Group IV compound, and any combination thereof.

The Group II-VI compound may be selected among a binary compound selected from CdSe, CdTe, ZnS, ZnSe, ZnTe, ZnO, HgS, HgSe, HgTe, MgSe, MgS, and any mixture thereof; a ternary compound selected from AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and any mixture thereof; and a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and any mixture thereof.

The Group III-V compound may be selected among a binary compound selected from GaN, GaP, GaAs, GaSb, AlN, AlP, AlAs, AlSb, InN, InP, InAs, InSb, and any mixture thereof; a ternary compound selected from GaNP, GaNAs, GaNSb, GaPAs, GaPSb, AlNP, AlNAs, AlNSb, AlPAs, AlPSb, InGaP, InNP, InNAs, InNSb, InPAs, InPSb, and any mixture thereof; and a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and any mixture thereof.

The Group IV-VI compound may be selected among a binary compound selected from SnS, SnSe, SnTe, PbS, PbSe, PbTe, and any mixture thereof; a ternary compound selected from SnSeS, SnSeTe, SnSTe, PbSeS, PbSeTe, PbSTe, SnPbS, SnPbSe, SnPbTe, and any mixture thereof; and a quaternary compound selected from SnPbSSe, SnPb-SeTe, SnPbSTe, and any mixture thereof. The Group IV element may be selected among Si, Ge, and any mixture thereof. The Group IV compound may include a binary compound selected from SiC, SiGe, and any mixture thereof.

In this case, the binary compound, the ternary compound, and/or the quaternary compound may exist in particles at a uniform (e.g., substantially uniform) concentration or may exist in the same particle having a concentration distribution partially divided into different states. Also, it may have a core/shell structure in which one quantum dot surrounds another quantum dot. The interface between the core and the shell may have a concentration gradient in which the concentration of elements in the shell decreases along a direction toward the center thereof.

In some embodiments, the quantum dot may have a core-shell structure including a core including nanocrystals and a shell surrounding the core, as described above. The shell of the quantum dot may function as a protection layer for preventing or reducing chemical modification of the core to maintain semiconductor characteristics and/or as a charging layer for assigning electrophoretic characteristics to the quantum dot. The shell may include a single layer or multiple layers. The interface between the core and the shell may have a concentration gradient in which the concentration of elements in the shell decreases toward the center thereof. Examples of the shell of the quantum dot may include a metal and/or nonmetal oxide, a semiconductor compound, or any combination thereof.

For example, the metal or nonmetal oxide may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and/or NiO, and/or a ternary compound such as $MgAl_2O_4$, $CoFe_2O_4$, $NiFe_2O_4$, and/or $CoMn_2O_4$; however, the disclosure is not limited thereto.

The semiconductor compound may include, for example, CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and/or the like; however, the disclosure is not limited thereto.

The quantum dot may have a full width at half maximum (FWHM) of an emission wavelength spectrum of about 45 nm or less, for example, about 40 nm or less or about 30 nm or less, and in this range, the color purity and/or the color reproducibility thereof may be improved. Also, because the light emitted through the quantum dot is emitted in all (e.g., substantially all) directions, the optical viewing angle thereof may be improved.

Also, the shapes of the quantum dots may be those generally used in the art and may include, but not limited to, spherical, pyramidal, multi-arm, and/or cubic nanoparticles, nanotubes, nanowires, nanofibers, nanoplate particles, and/or the like.

The quantum dot may control the color of light emitted according to the particle size, and thus the quantum dot may have various suitable emission colors such as blue, red, and green.

The first scatterer SC1, the second scatterer SC2, and the third scatterer SC3 may scatter light such that more light may be emitted (e.g., by the display apparatus 1). The first scatterer SC1, the second scatterer SC2, and the third scatterer SC3 may increase the light output efficiency (e.g., of the display apparatus 1). At least one of the first scatterer SC1, the second scatterer SC2, and the third scatterer SC3 may include any suitable material among metal and metal oxide for uniformly (e.g., substantially uniformly) scattering light. For example, at least one of the first scatterer SC1, the second scatterer SC2, and the third scatterer SC3 may include at least one of $TiO_2$, $ZrO_2$, $Al_2O_3$, $In_2O_3$, ZnO, SnO$_2$, Sb$_2$O$_3$, and ITO. Also, at least one of the first scatterer SC1, the second scatterer SC2, and the third scatterer SC3 may have a refractive index of 1.5 or more. Thus, the light output efficiency of the functional layer 700 may be improved. In some embodiments, at least one of the first scatterer SC1, the second scatterer SC2, and the third scatterer SC3 may be omitted.

The first base resin BR1, the second base resin BR2, and the third base resin BR3 may include a transparent material. For example, at least one of the first base resin BR1, the second base resin BR2, and the third base resin BR3 may include a polymer resin such as acryl, benzocyclobutene (BCB), and/or hexamethyldisiloxane (HMDSO).

The second capping layer CL2 may be over the bank 600 and the functional layer 700. The second capping layer CL2 may protect the bank 600 and the functional layer 700. The second capping layer CL2 may prevent or reduce penetration of impurities such as moisture and/or air from the outside to damage and/or contaminate the bank 600 and/or the functional layer 700. The second capping layer CL2 may include an inorganic material.

In the display apparatus 1 described above, light of a second wavelength band may be emitted from the first subpixel PX1 to the outside, light of a third wavelength band may be emitted from the second subpixel PX2 to the outside, and light of a first wavelength band may be emitted from the third subpixel PX3 to the outside. In some embodiments, the display apparatus 1 may display a full-color image.

The filling layer 30 may be arranged between the display panel 10 and the color conversion panel 20. In an embodiment, the filling layer 30 may be arranged between the encapsulation layer 300 and the bank 600. The filling layer 30 may buffer an external pressure and/or the like. The filling layer 30 may include a filler. In an embodiment, the filling layer 30 may include a thermocurable and/or photocurable filler. The filler may include an organic material such as methyl silicone, phenyl silicone, and/or polyimide. However, the disclosure is not limited thereto, and the filler may include a urethane-based resin, an epoxy-based resin, and/or an acrylic resin that is an organic sealant, an inorganic sealant, and/or silicone.

Referring to FIG. 3B, one of the display panel 10 and the color conversion panel 20 may include a column spacer 800. In an embodiment, the color conversion panel 20 may include the column spacer 800. In another embodiment, the display panel 10 may include the column spacer 800. Hereinafter, a case where the color conversion panel 20 includes the column spacer 800 will be mainly described in more detail. The column spacer 800 may be over the bank 600 and may face the lower substrate 100. The column spacer 800 may separate the encapsulation layer 300 and the bank 600 from each other. The column spacer 800 may pass through the filling layer 30. The column spacer 800 may include an organic material. In an embodiment, the column spacer 800 may include an acryl-based material.

The column spacer 800 may separate the light emitting device and the functional layer 700 from each other by a uniform (e.g., substantially uniform) distance. Thus, the filling layer 30 may be arranged with a uniform (e.g., substantially uniform) thickness in the display area DA. In other words, the distance between the first organic light emitting diode OLED1 and the first quantum dot layer 710 may be substantially equal to the distance between the second organic light emitting diode OLED2 and the second quantum dot layer 720. Also, the distance between the second organic light emitting diode OLED2 and the second quantum dot layer 720 may be substantially equal to the distance between the third organic light emitting diode OLED3 and the transmission layer 730. When the column spacer 800 is omitted unlike in the present embodiments, a plurality of light emitting devices and the functional layer may not maintain a uniform (e.g., substantially uniform) distance therebetween. For example, the thickness of the filling layer 30 in the first transparent area CA1 may be different from the thickness of the filling layer 30 in the second transparent area CA2. In this case, the brightness of the light emitted from the first organic light emitting diode OLED1 and passed through the filling layer 30 overlapping the first transparent area CA1 may be different from the brightness of the light emitted from the second organic light emitting diode OLED2 and passed through the filling layer 30 overlapping the second transparent area CA2. In the present embodiments, the column spacer 800 may be arranged to pass through the filling layer 30, and the light emitting device and the functional layer 700 may be separated from each other by a uniform (e.g., substantially uniform) distance. Also, the difference in brightness depending on the positions in the display area DA may be prevented or reduced due to the filling layer 30.

Figure 4:
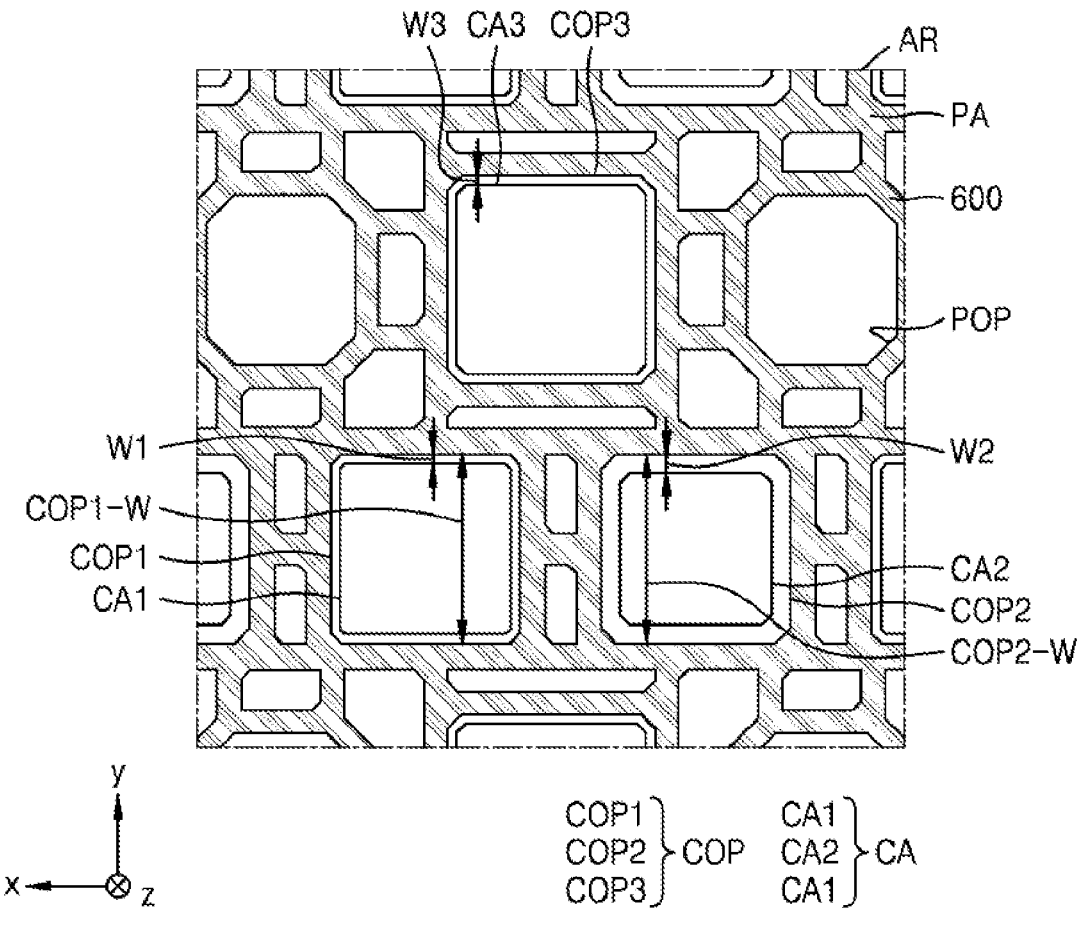
FIG. 4 is a plan view schematically illustrating a portion of a color conversion panel according to an embodiment.

FIG. 4 is a plan view schematically illustrating a portion of a color conversion panel according to an embodiment. FIG. 4 is an enlarged plan view of the color conversion panel 20 corresponding to region AR in the display apparatus 1 of FIG. 1.

Referring to FIG. 4, the color conversion panel 20 may include an upper substrate 400, a bank 600, and a functional layer 700. The upper substrate 400 may include a transparent area CA and a peripheral area PA. The transparent area CA may be an area in which the color filter layer 500 is arranged. In some embodiments, the transparent area CA may be an area in which only one color filter is arranged. The peripheral area PA may be a light blocking area. In an embodiment, the transparent area CA may include a first transparent area CA1, a second transparent area CA2, and a third transparent area CA3. The first transparent area CA1, the second transparent area CA2, and the third transparent area CA3 may be spaced apart from each other. In FIG. 4, the center of the first transparent area CA1, the center of the second transparent area CA2, and the center of the third transparent area CA3 may be arranged to form the vertexes of a virtual triangle. In this case, only the first color filter 510 may be arranged in the first transparent area CA1, only the second color filter 520 may be arranged in the second transparent area CA2, and only the third color filter 530 may be arranged in the third transparent area CA3.

The planar shape of at least one of the first transparent area CA1, the second transparent area CA2, and the third transparent area CA3 described above may be rectangular or square. Hereinafter, for convenience of description, a case where all of the planar shape of the first transparent area CA1, the planar shape of the second transparent area CA2, and the planar shape of the third transparent area CA3 are square will be mainly described in more detail.

As an embodiment, the edge of at least one of the planar shape of the first transparent area CA1, the planar shape of the second transparent area CA2, and the planar shape of the third transparent area CA3 may be rounded and/or chamfered. As another embodiment, the edge of at least one of the planar shape of the first transparent area CA1, the planar shape of the second transparent area CA2, and the planar shape of the third transparent area CA3 may not be chamfered. Hereinafter, for convenience of description, a case where all of the edges of the planar shape of the first transparent area CA1, the planar shape of the second transparent area CA2, and the planar shape of the third transparent area CA3 are chamfered will be mainly described in more detail.

The first transparent area CA1 and the second transparent area CA2 described above may be arranged in the same column or row. In some embodiments, the first transparent area CA1 and the second transparent area CA2 may be arranged in a line in a first direction (e.g., one of the x-axis direction and the y-axis direction of FIG. 4). In this case, the first transparent area CA1 and the second transparent area CA2 may be respectively provided as a plurality of first transparent areas CA1 and a plurality of second transparent areas CA2, and some of the plurality of first transparent areas CA1 and some of the second transparent areas CA2 may be alternately arranged in the first direction. Also, each of some others of the plurality of first transparent areas CA1 and some others of the plurality of second transparent areas CA2 may be arranged in a line in a second direction (e.g., another of the x-axis direction and the y-axis direction of FIG. 4). The third transparent area CA3 may be arranged to be spaced apart from the first transparent area CA1 and the second transparent area CA2 in the second direction. The third transparent area CA3 may be arranged in a line different from a line in which the first transparent area CA1 and the second transparent area CA2 are arranged. In some embodiments, the center of the first transparent area CA1, the center of the second transparent area CA2, and the third transparent area CA3 may form a triangle in the plan view. In this case, a plurality of third transparent areas CA3 may be arranged in a line in the first direction and the second direction, and the first direction and the second direction may be perpendicular (e.g., substantially perpendicular) to each other.

The peripheral area PA may be arranged outside the transparent area CA. The peripheral area PA may at least partially surround the transparent area CA. In an embodiment, the peripheral area PA may entirely surround the transparent area CA. The peripheral area PA may entirely surround the first transparent area CA1. The peripheral area PA may entirely surround the second transparent area CA2. The peripheral area PA may entirely surround the third transparent area CA3.

The bank 600 may include an opening portion COP and a peripheral opening portion POP. In an embodiment, the area of the opening portion COP may be greater than the area of the peripheral opening portion POP. The opening portion COP may overlap the transparent area CA. The functional layer 700 may fill the opening portion COP. The opening portion COP may include a first opening portion COP1, a second opening portion COP2, and a third opening portion COP3. The first opening portion COP1 may be arranged in the first transparent area CA1. The second opening portion COP2 may be arranged in the second transparent area CA2. The third opening portion COP3 may be arranged in the third transparent area CA3. In this case, the arrangement of the opening portions COP may be equal or similar to the arrangement of the transparent area CA described above.

The planar shape of at least one of the first opening portion COP1, the second opening portion COP2, and the third opening portion COP3 may be square. Hereinafter, for convenience of description, a case where all of the planar shape of the first opening portion COP1, the planar shape of the second opening portion COP2, and the planar shape of the third opening portion COP3 are square will be mainly described in more detail.

In the above case, in the plan view, the edge (or inner surface) of the opening portion COP and the edge of the transparent area CA may be spaced apart from each other instead of matching each other. In this case, the distances from the edges of the opening portion COP to the edges of the transparent area CA may be different from or equal to each other along the edges of the opening portion COP. Hereinafter, for convenience of description, a case where the distances from the edges of the opening portion COP to the edges of the transparent area CA are equal to each other along the edges of the opening portion COP will be mainly described in more detail.

The distances from the edges of the opening portion COP to the edges of the transparent area CA may be different from each other in each of the opening portions COP. For example, a first distance W1 from the edge of the first opening portion COP1 to the edge of the first transparent area CA1 may be different from a second distance W2 from the edge of the second opening portion COP2 to the edge of the second transparent area CA2. In this case, the first distance W1 may be less than the second distance W2. In this case, the first distance W1 may be about 4.9 μm or more and less than about 30 μm, and the second distance W2 may be about 5.5 μm or more and about 30 μm or less.

Also, a third distance W3 from the edge of the third opening portion COP3 to the edge of the third transparent area CA3 may be equal to the first distance W1.

In the above case, a first width COP1-W of the first opening portion COP1 measured in the second direction may be equal to a second width COP2-W of the second opening portion COP2. In this case, the area of the planar shape of the first opening portion COP1 may be equal to the area of the planar shape of the second opening portion COP2. In some embodiments, the first opening portion COP1 and the second opening portion COP2 may have the same planar shape and the same size of the planar shape. In this case, the planar shape of the first transparent area CA1 may be the same as the planar shape of the second transparent area CA2, but the area of the planar shape of the first transparent area CA1 may be greater than the area of the planar shape of the second transparent area CA2.

As above, when the first opening portion COP1 and the second opening portion COP2 have the same planar shape and the same size of the planar shape, the functional layer 700 arranged in the second opening portion COP2 may be stably stored.

The peripheral opening portion POP may be arranged in the peripheral area PA. The peripheral opening portion POP may include a plurality of peripheral opening portions POP. The plurality of peripheral opening portions POP may have various suitable shapes such as polygonal shapes or circular shapes. In an embodiment, in the plan view, the plurality of peripheral opening portions POP may surround the opening portion COP. For example, in the plan view, the plurality of peripheral opening portions POP may surround the first opening portion COP1. In the plan view, the plurality of peripheral opening portions POP may surround the second opening portion COP2. In the plan view, the plurality of peripheral opening portions POP may surround the third opening portion COP3.

The peripheral opening portion POP may have a structure for increasing the reliability of the color conversion panel 20. For example, the functional layer 700 may be formed by an inkjet printing process. When the functional layer 700 is formed by discharging ink to the opening portion COP, an accurate alignment between an inkjet discharge port and the opening portion COP may be desired or required. When the inkjet discharge port and the opening portion COP are not accurately aligned with each other, the functional layer 700 may be formed on the upper surface of the bank 600. In this case, the functional layer 700 formed on the upper surface of the bank 600 may cause damage such as cracks to the encapsulation layer 300 when the color conversion panel 20 and the display panel 10 are bonded to each other. Alternatively, due to the functional layer being 700 formed on the upper surface of the bank 600 due to the misalignment of the inkjet discharge port and the opening portion COP, the filling layer 30 may not be uniformly arranged between the display panel 10 and the color conversion panel 20. In the present embodiments, because the plurality of peripheral opening portions POP surround the opening portion COP in the plan view, the formation of the functional layer 700 on the upper surface of the bank 600 may be prevented or reduced. When ink is discharged to the upper surface of the bank 600, the ink may flow into the peripheral opening portion POP. Thus, the peripheral opening portion POP may prevent or reduce damage to the encapsulation layer 300, and the filling layer 30 may have a uniform (e.g., substantially uniform) thickness. In this case, the plurality of peripheral opening portions POP described above may be arranged around the opening portion COP.

The functional layer 700 may be arranged in the opening portion COP. The functional layer 700 may fill the opening portion COP. In an embodiment, the functional layer 700 may include at least one of a color conversion material and a scatterer (e.g., a light scatterer). In an embodiment, the color conversion material may include a quantum dot. In an embodiment, the functional layer 700 may include a first quantum dot layer 710, a second quantum dot layer 720, and a transmission layer 730. The first quantum dot layer 710 may be arranged in the first opening portion COP1. The second quantum dot layer 720 may be arranged in the second opening portion COP2. The transmission layer 730 may be arranged in the third opening portion COP3.

FIGS. 5A to 5D are cross-sectional views illustrating a structure of a first light emitting device according to an embodiment.

Referring to FIGS. 5A to 5D, the first light emitting device, the second light emitting device, and the third light emitting device described above may include the same structure. Hereinafter, for convenience of description, the first light emitting device will be mainly described in more detail.

In an embodiment, the intermediate layer 220 included in the first light emitting device described above may include two or more emission units sequentially stacked between the first subpixel electrode 210R and the opposite electrode 230, and a charge generation layer CGL arranged between the two emission units. When the intermediate layer 220 includes an emission unit and a charge generation layer CGL, the first light emitting device may be a tandem light emitting device. Because the first light emitting device has a stack structure of a plurality of emission units, the color purity and the light emission efficiency may be improved.

One emission unit may include an emission layer and a first functional layer and a second functional layer under and over the emission layer, respectively. The charge generation layer CGL may include a negative charge generation layer and a positive charge generation layer. The light emission efficiency of the first light emitting device that is a tandem light emitting device including a plurality of emission layers may be further improved by the negative charge generation layer and the positive charge generation layer.

The negative charge generation layer may be an n-type charge generation layer. The negative charge generation layer may supply electrons. The negative charge generation layer may include a host and a dopant. The host may include an organic material. The dopant may include a metal material. The positive charge generation layer may be a p-type charge generation layer. The positive charge generation layer may supply holes. The positive charge generation layer may include a host and a dopant. The host may include an organic material. The dopant may include a metal material.

Figure 5A:
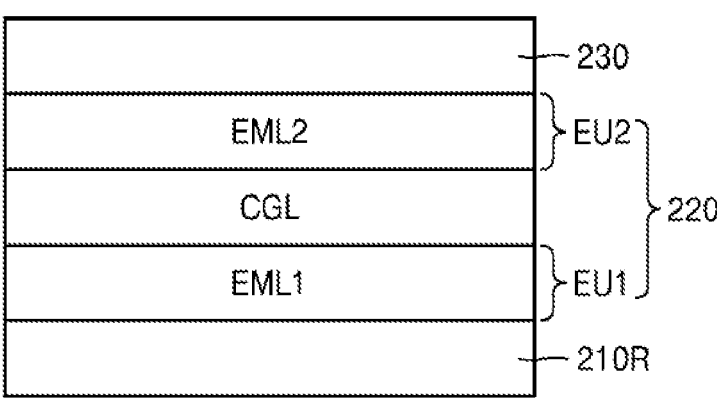
FIGS. 5A to 5D are cross-sectional views illustrating a structure of a first light emitting device according to an embodiment.

In an embodiment, as illustrated in FIG. 5A, the first light emitting device may include a first emission unit EU1 including a first emission layer EML1 and a second emission unit EU2 including a second emission layer EML2, which are sequentially stacked. The charge generation layer CGL may be provided between the first emission unit EU1 and the second emission unit EU2. For example, the first light emitting device may include a first subpixel electrode 210R, a first emission layer EML1, a charge generation layer CGL, a second emission layer EML2, and an opposite electrode 230 that are sequentially stacked. A first functional layer and a second functional layer may be included under and over the first emission layer EML1, respectively. A first functional layer and a second functional layer may be included under and over the second emission layer EML2, respectively. The first emission layer EML1 may be a blue emission layer, and the second emission layer EML2 may be a yellow emission layer.

Figure 5B:
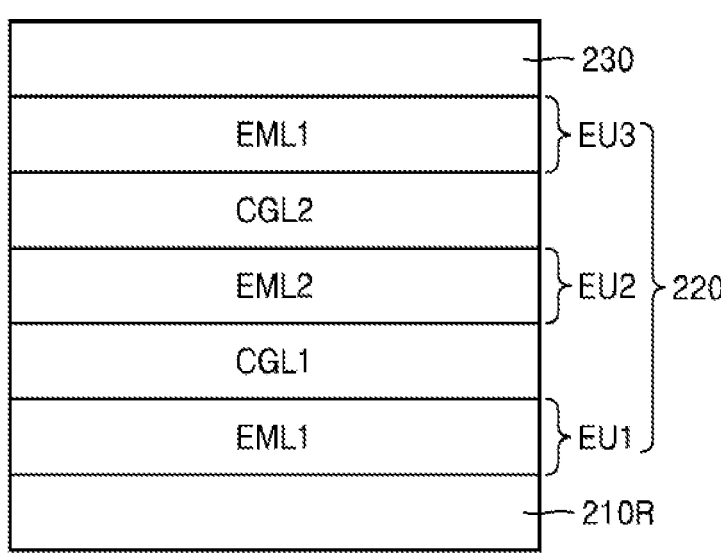

In an embodiment, as illustrated in FIG. 5B, the first light emitting device may include a first emission unit EU1 and a third emission unit EU3 each including a first emission layer EML1 and a second emission unit EU2 including a second emission layer EML2. A first charge generation layer CGL1 may be provided between the first emission unit EU1 and the second emission unit EU2, and a second charge generation layer CGL2 may be provided between the second emission unit EU2 and the third emission unit EU3. For example, the first light emitting device may include a first subpixel electrode 210R, a first emission layer EML1, a first charge generation layer CGL1, a second emission layer EML2, a second charge generation layer CGL2, a first emission layer EML1, and an opposite electrode 230 that are sequentially stacked. A first functional layer and a second functional layer may be included under and over the first emission layer EML1, respectively. A first functional layer and a second functional layer may be included under and over the second emission layer EML2, respectively. The first emission layer EML1 may be a blue emission layer, and the second emission layer EML2 may be a yellow emission layer.

In an embodiment, in the first light emitting device, in addition to the second emission layer EML2, the second emission unit EU2 may further include a third emission layer EML3 and/or a fourth emission layer EML4 directly contacting (e.g., physically contacting) under and/or over the second emission layer EML2. Here, directly contacting may mean that no other layer is arranged between the second emission layer EML2 and the third emission layer EML3 and/or between the second emission layer EML2 and the fourth emission layer EML4. The third emission layer EML3 may be a red emission layer, and the fourth emission layer EML4 may be a green emission layer.

Figure 5C:
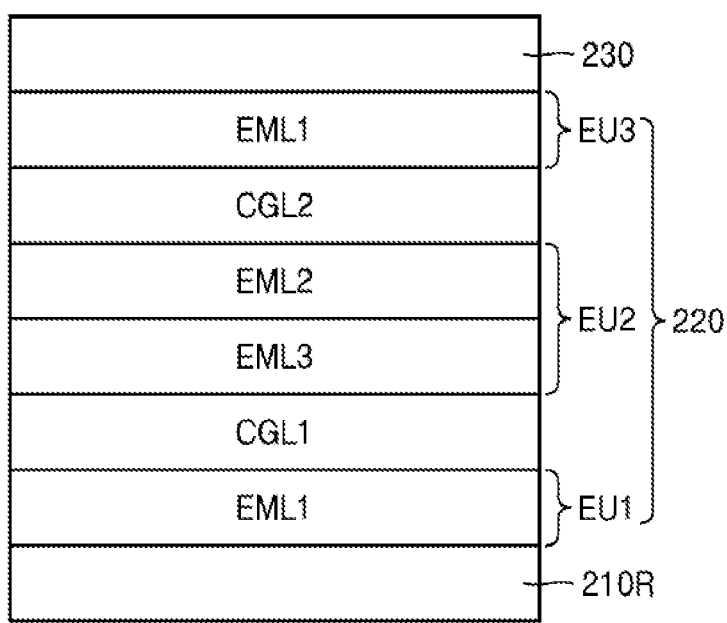
Figure 5D:
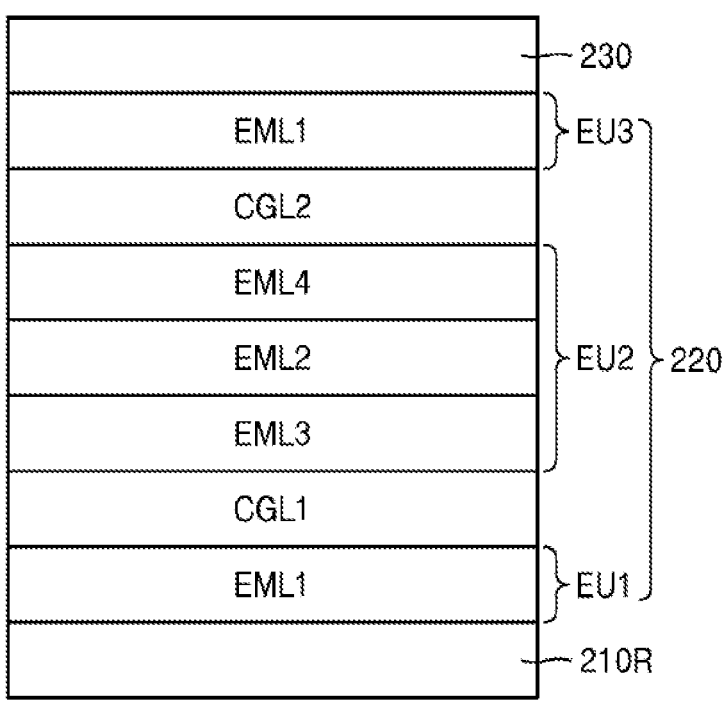

For example, as illustrated in FIG. 5C, the first light emitting device may include a first subpixel electrode 210R, a first emission layer EML1, a first charge generation layer CGL1, a third emission layer EML3, a second emission layer EML2, a second charge generation layer CGL2, a first emission layer EML1, and an opposite electrode 230 that are sequentially stacked. In some embodiments, as illustrated in FIG. 5D, the first light emitting device may include a first subpixel electrode 210R, a first emission layer EML1, a first charge generation layer CGL1, a third emission layer EML3, a second emission layer EML2, a fourth emission layer EML4, a second charge generation layer CGL2, a first emission layer EML1, and an opposite electrode 230 that are sequentially stacked.

Figure 6A:
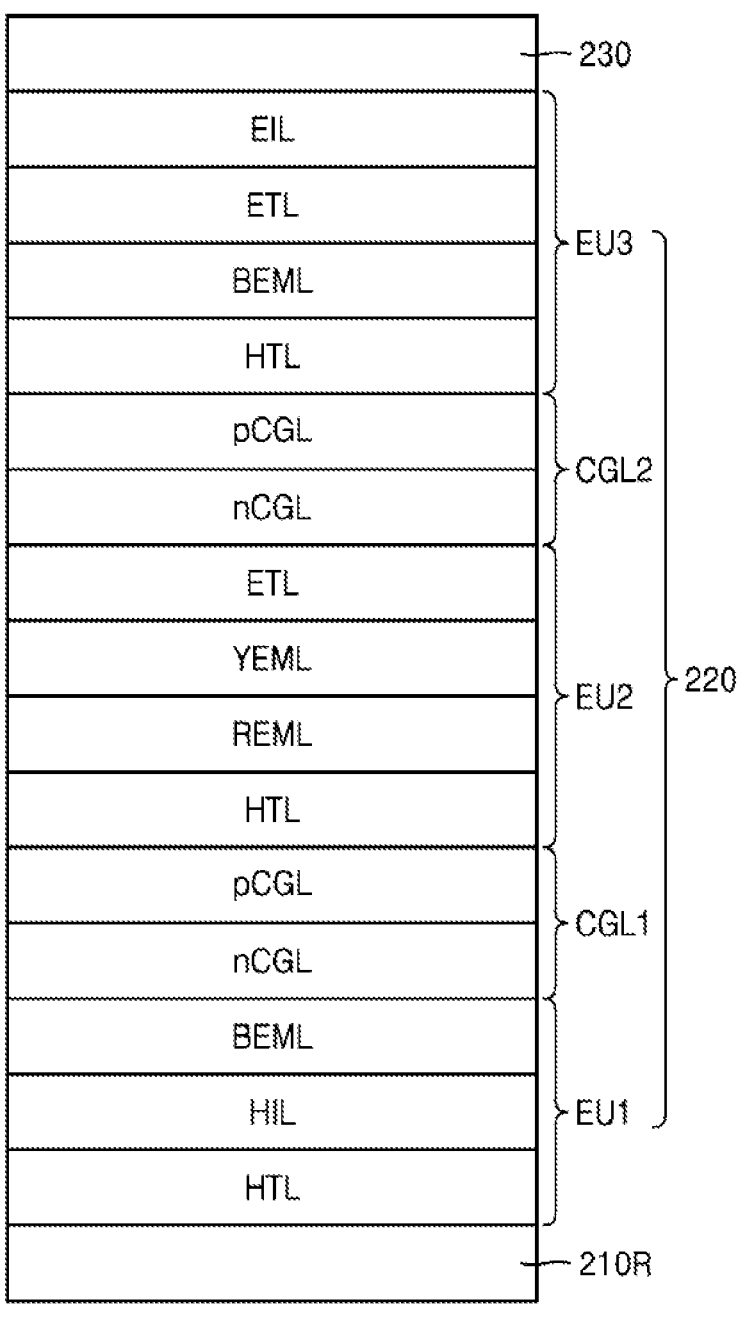
FIG. 6A is a cross-sectional view illustrating an example of the first light emitting device of FIG. 5C.
Figure 6B:
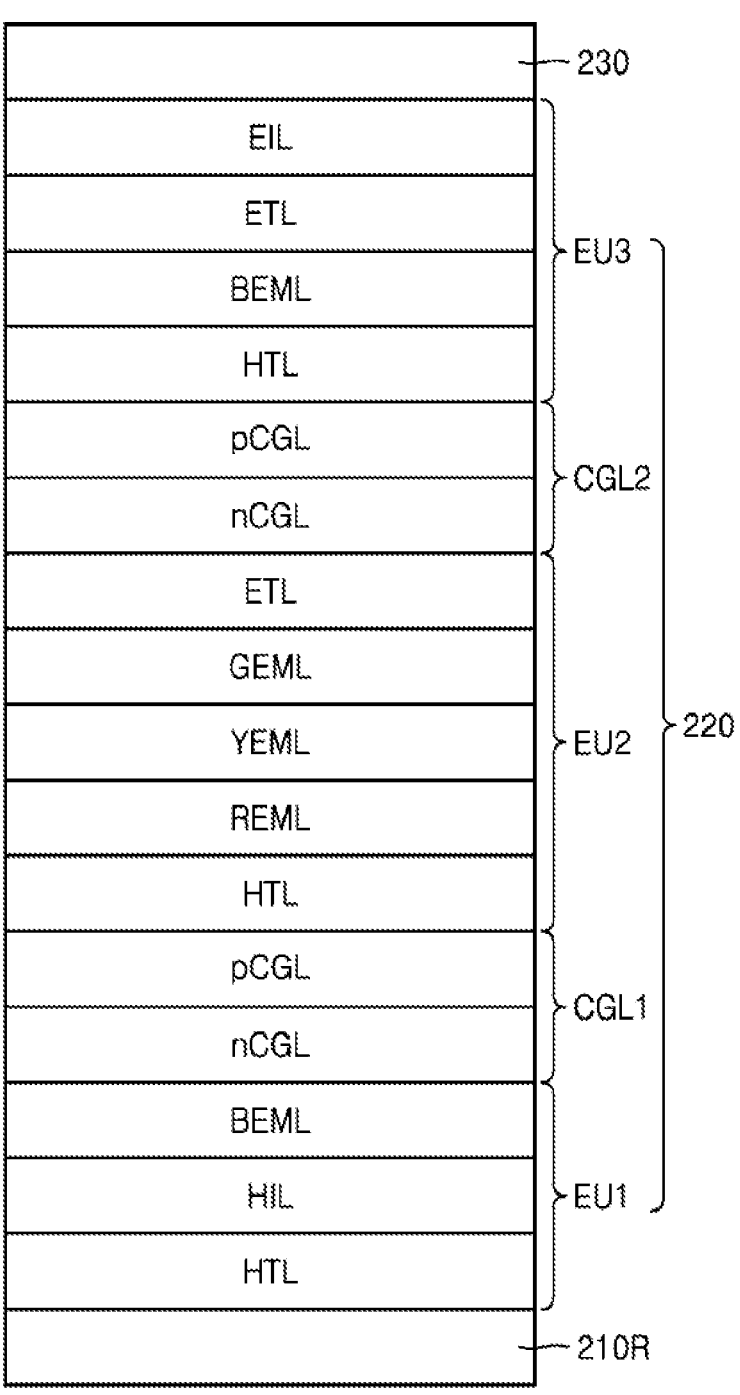
FIG. 6B is a cross-sectional view illustrating an example of the first light emitting device of FIG. 5D.

FIG. 6A is a cross-sectional view illustrating an example of the first light emitting device of FIG. 5C. FIG. 6B is a cross-sectional view illustrating an example of the first light emitting device of FIG. 5D.

Referring to FIG. 6A, the first light emitting device may include a first emission unit EU1, a second emission unit EU2, and a third emission unit EU3 that are sequentially stacked. A first charge generation layer CGL1 may be provided between the first emission unit EU1 and the second emission unit EU2, and a second charge generation layer CGL2 may be provided between the second emission unit EU2 and the third emission unit EU3. Each of the first charge generation layer CGL1 and the second charge generation layer CGL2 may include a negative charge generation layer nCGL and a positive charge generation layer pCGL.

The first emission unit EU1 may include a blue emission layer BEML. The first emission unit EU1 may further include a hole injection layer HIL and a hole transport layer HTL between the first subpixel electrode 210R and the blue emission layer BEML. In an embodiment, a p-doped layer may be further included between the hole injection layer HIL and the hole transport layer HTL. The p-doped layer may be formed by doping the hole injection layer HIL with a p-type dopant. In an embodiment, at least one of a blue light auxiliary layer, an electron blocking layer, and a buffer layer may be further included between the blue emission layer BEML and the hole transport layer HTL. The blue light auxiliary layer may increase the light output efficiency of the blue emission layer BEML. The blue light auxiliary layer may adjust the hole charge balance to increase the light output efficiency of the blue emission layer BEML. The electron blocking layer may prevent or reduce the injection of electrons into the hole transport layer HTL. The buffer layer may compensate for the resonance distance depending on the wavelength of light emitted from the emission layer.

The second emission unit EU2 may include a yellow emission layer YEML and a red emission layer REML directly contacting (e.g., physically contacting) the yellow emission layer YEML under the yellow emission layer YEML. The second emission unit EU2 may further include a hole transport layer HTL between the red emission layer REML and the positive charge generation layer pCGL of the first charge generation layer CGL1 and may further include an electron transport layer ETL between the yellow emission layer YEML and the negative charge generation layer nCGL of the second charge generation layer CGL2.

The third emission unit EU3 may include a blue emission layer BEML. The third emission unit EU3 may further include a hole transport layer HTL between the blue emission layer BEML and the positive charge generation layer pCGL of the second charge generation layer CGL2. The third emission unit EU3 may further include an electron transport layer ETL and an electron injection layer EIL between the blue emission layer BEML and the opposite electrode 230. The electron transport layer ETL may include a single layer or multiple layers. In an embodiment, at least one of a blue light auxiliary layer, an electron blocking layer, and a buffer layer may be further included between the blue emission layer BEML and the hole transport layer HTL. At least one of a hole blocking layer and a buffer layer may be further included between the blue emission layer BEML and the electron transport layer ETL. The hole blocking layer may prevent or reduce the injection of holes into the electron transport layer ETL.

The first light emitting device illustrated in FIG. 6B may be different from the first light emitting device illustrated in FIG. 6A in terms of the stack structure of the second emission unit EU2, and other configurations thereof may be the same as those illustrated in FIG. 6A. Referring to FIG. 6B, the second emission unit EU2 may include a green emission layer GEML, a red emission layer REML directly contacting (e.g., physically contacting) the green emission layer GEML under the green emission layer GEML, and a yellow emission layer YEML directly contacting (e.g., physically contacting) the green emission layer GEML over the green emission layer GEML. The second emission unit EU2 may further include a hole transport layer HTL between the red emission layer REML and the positive charge generation layer pCGL of the first charge generation layer CGL1 and may further include an electron transport layer ETL between the yellow emission layer YEML and the negative charge generation layer nCGL of the second charge generation layer CGL2.

Figure 7:
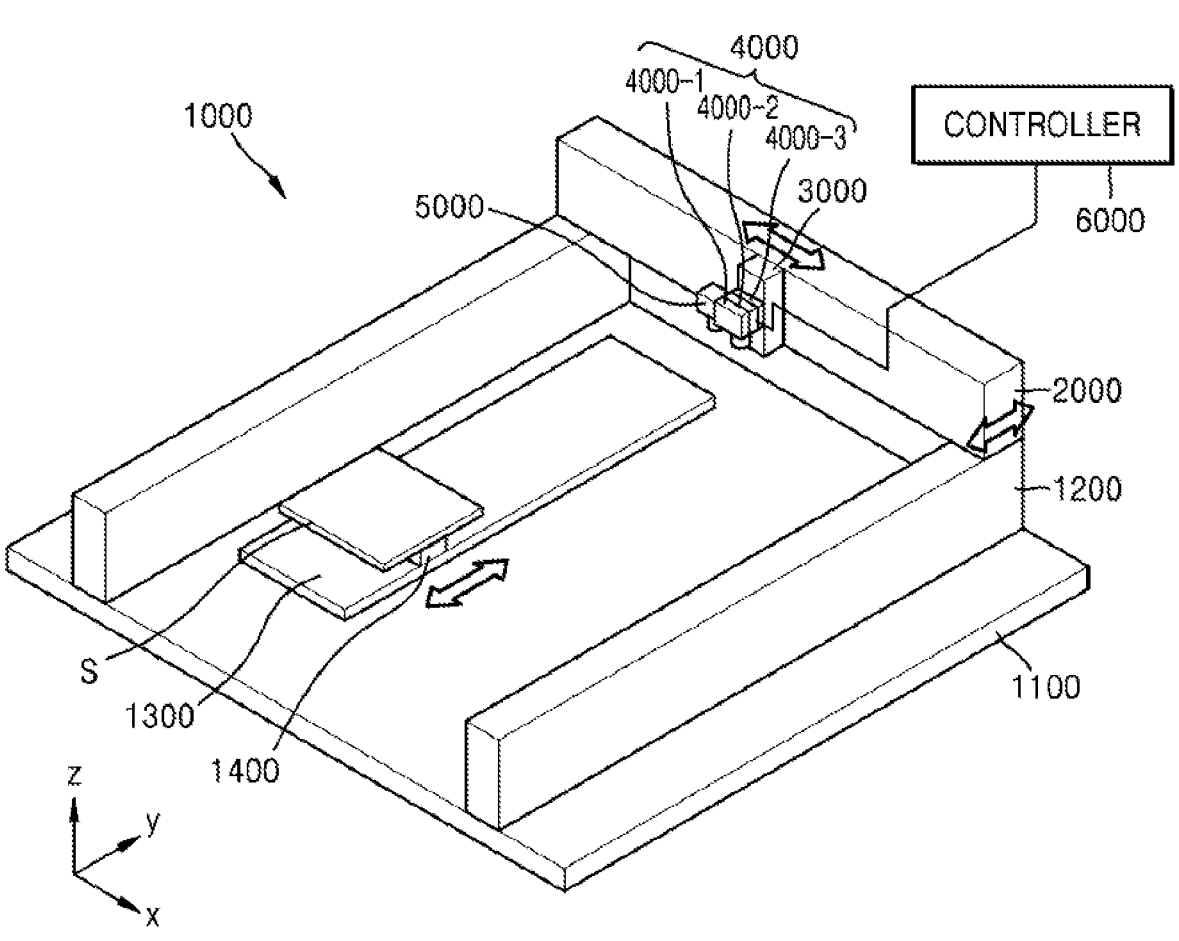
FIG. 7 is a perspective view schematically illustrating a display apparatus manufacturing apparatus according to an embodiment.

FIG. 7 is a perspective view schematically illustrating a display apparatus manufacturing apparatus according to an embodiment.

Referring to FIG. 7, a display apparatus manufacturing apparatus 1000 may include a stage 1100, a gantry 2000, a moving unit 3000, a droplet discharger 4000, and a controller 6000.

The stage 1100 may include a guide member 1200 and a substrate moving member 1300. The stage 1100 may include an alignment mark for aligning an upper substrate unit S.

Here, the upper substrate unit S may be a color conversion panel under manufacture. For example, the upper substrate unit S may be a color conversion panel under manufacture including a layer from the upper substrate 400 to the color filter layer 500, the refractive layer RL, the first capping layer CL1, and the bank 600 illustrated in FIGS. 3A and 3B. In this case, the display apparatus manufacturing apparatus 1000 may form a functional layer on the upper substrate unit S.

The guide member 1200 may be arranged apart on both sides with the substrate moving member 1300 therebetween. The length of the guide member 1200 may be greater than the length of one side of the upper substrate unit S. In this case, the length of the guide member 1200 and the length of one side of the upper substrate unit S may be measured in the y direction of FIG. 7.

The gantry 2000 may be on the guide member 1200. In an embodiment, the guide member 1200 may include a uniform (e.g., substantially uniform) rail such that the gantry 2000 may be linearly movable in the lengthwise direction of the guide member 1200. In some embodiments, the guide member 1200 may include a linear motion rail.

The substrate moving member 1300 may be on the stage 1100 and may include a substrate rotating member 1400. The substrate moving member 1300 may extend in the lengthwise direction of the guide member 1200. For example, referring to FIG. 7, the substrate moving member 1300 may extend in the y direction. Also, the substrate moving member 1300 may include a rail such that the substrate rotating member 1400 may be linearly movable. In some embodiments, the substrate moving member 1300 may include a linear motion rail.

The substrate rotating member 1400 may rotate on the substrate moving member 1300. When the substrate rotating member 1400 rotates, the upper substrate unit S on the substrate rotating member 1400 may rotate. In an embodiment, the substrate rotation member 1400 may rotate around a rotation axis perpendicular (e.g., substantially perpendicular) to one surface of the stage 1100 on which the upper substrate unit S is seated. When the substrate rotating member 1400 rotates around the rotation axis perpendicular (e.g., substantially perpendicular) to one surface of the stage 1100 on which the upper substrate unit S is seated, the upper substrate unit S on the substrate rotating member 1400 may also rotate around the rotation axis perpendicular (e.g., substantially perpendicular) to one surface of the stage 1100 on which the upper substrate unit S is seated.

The gantry 2000 may be on the guide member 1200. In some embodiments, the gantry 200 may be on the guide member 1200 arranged apart on both sides with the substrate moving member 1300 therebetween.

The gantry 2000 may move in the lengthwise direction of the guide member 1200. In an embodiment, the gantry 2000 may move manually linearly or may move automatically linearly by including a motor cylinder and/or the like. For example, the gantry 2000 may move automatically linearly by including a linear motion block moving along a linear motion rail.

The moving unit 3000 and the droplet discharger 4000 for discharging droplets may be on the gantry 2000. In an embodiment, the moving unit 3000 may move linearly on the gantry 2000. For example, the gantry 2000 may include a uniform (e.g., substantially uniform) rail such that the moving unit 3000 may move linearly.

The moving unit 3000 may include at least one nozzle moving unit. The droplet discharger 4000 may include at least one discharger, and the at least one discharger may be arranged in various suitable ways. In this case, the moving unit 3000 may move linearly on the gantry 2000, and the droplet discharger 4000 may be on the moving unit 3000 to supply droplets to the upper substrate unit S. For example, one nozzle moving unit may be provided, and one discharger may be provided. In this case, the discharger may include at least one or more nozzle heads for discharging droplets.

As another example, at least one or more dischargers may be provided, and one nozzle moving unit may be provided. In this case, when a plurality of dischargers are provided, the plurality of dischargers may be arranged in one nozzle moving unit and thus the plurality of dischargers may be concurrently (e.g., simultaneously) moved according to the movement of the nozzle moving unit.

As another example, a plurality of nozzle moving units may be provided, and a plurality of dischargers may be provided. In this case, at least one or more dischargers may be arranged in one nozzle moving unit. Hereinafter, for convenience of description, a case where one nozzle moving unit and one discharger are arranged will be mainly described in more detail.

The moving unit 3000 may move linearly on the gantry 2000. In some embodiments, the moving unit 3000 may move in the lengthwise direction of the gantry 2000. For example, the moving unit 3000 may move in the x direction or the −x direction.

In an embodiment, the moving unit 3000 may move manually linearly. In other embodiments, the moving unit 3000 may move automatically linearly by including a motor, a cylinder, and/or the like. For example, the moving unit 3000 may include a linear motion block moving along a linear motion rail. Hereinafter, for convenience of description, a case where the moving unit 3000 moves automatically linearly will be mainly described in more detail.

The discharger of the droplet discharger 4000 may be arranged on the nozzle moving unit of the moving unit 3000. In this case, the discharger of the droplet discharger 4000 may supply droplets to the upper substrate unit S. In this case, the discharger of the droplet discharger 4000 may supply various suitable materials to the upper substrate unit S. For example, the droplet discharger 4000 may include a first discharger 4000-1, a second discharger 4000-2, and a third discharger 4000-3 that are arranged in a line.

In the above case, at least one of first to third dischargers 4000-1 to 4000-3 may include a nozzle for discharging droplets. Hereinafter, for convenience of description, a case where each of the first to third dischargers 4000-1 to 4000-3 includes a plurality of nozzles will be mainly described in more detail.

The droplet discharger 4000 may discharge droplets to the upper substrate unit S. In this case, the droplets may include a quantum dot, a scatterer, and a base resin.

The amount of droplets discharged by each of the first discharger 4000-1, the second discharger 4000-2, and the third discharger 4000-3 may be independently controlled. In this case, each of the first discharger 4000-1, the second discharger 4000-2, and the third discharger 4000-3 may be electrically connected to the controller 6000. Thus, the amount of droplets discharged by each of the first discharger 4000-1, the second discharger 4000-2, and the third discharger 4000-3 may be separately controlled by the controller 6000.

In the above case, the materials discharged by the first discharger 4000-1, the second discharger 4000-2, and the third discharger 4000-3 may be different from each other. For example, the first discharger 4000-1 may provide a first material for forming a first quantum dot layer, the second discharger 4000-2 may provide a second material for forming a second quantum dot layer, and the third discharger 4000-3 may provide a third material for forming a third quantum dot layer.

A measurer 5000 may photograph the upper substrate unit S or may photograph an opening portion of the upper substrate unit S. The measurer 5000 may include a confocal microscope and/or an interferometric microscope. The confocal microscope may be a microscope that may obtain several two-dimensional images of an object at different depths and reconstruct a three-dimensional structure of the object based on the obtained two-dimensional images. The confocal microscope may be, for example, a chromatic confocal microscope, a chromatic line confocal microscope, and/or the like. The interferometric microscope may be a microscope that quantitatively measures by observing a change in the unevenness of a microstructure of an object, a change in the phase, and/or the like. The interferometric microscope may be, for example, a laser interferometric microscope, a white light interferometric microscope, and/or the like. As another embodiment, the measurer 5000 may include an illuminator, a lens, and a camera. In this case, the measurer 5000 may be arranged in the form of the illuminator, lens, and camera from a portion close to a droplet. The measurer 5000 is not limited thereto and may include any suitable device and structure for obtaining an image of the droplet. Hereinafter, for convenience of description, a case where the measurer 5000 includes the illuminator, the lens, and the camera will be mainly described in more detail.

The controller 6000 may control the position of the droplet discharger 4000 based on the image obtained by the measurer 5000. For example, the controller 6000 may control the position of the droplet discharger 4000, the type (or kind) of a droplet supplied from each nozzle, the amount of droplets, and/or the like.

When a display apparatus is manufactured through the display apparatus manufacturing apparatus 1000 described above, the display apparatus manufacturing apparatus 1000 may manufacture a color conversion panel. In this case, as described above, after the upper substrate unit S is over the stage 1100, the positions of the upper substrate unit S and the droplet discharger 4000 may be set to correspond to each other. In this case, based on the image obtained by the measurer 5000, the gantry 2000 and the substrate moving member 1300 may be controlled such that the position of the upper substrate unit S may correspond to a preset position.

After the above process is completed, the controller 6000 may apply droplets to the upper substrate unit S through the droplet discharger 4000 while moving the upper substrate unit S and the droplet discharger 4000 relatively to each other in the first direction. As an embodiment, the controller 6000 may linearly move the upper substrate unit S by linearly moving the substrate rotating member 1400 through the substrate moving member 1300 in a state where the position of the droplet discharger 4000 is fixed. As another embodiment, it may also be possible to linearly move the droplet discharger 4000 by linearly moving the gantry 2000 in a state where the position of the upper substrate unit S is fixed. As another embodiment, the controller 6000 may linearly move the upper substrate unit S and the droplet discharger 4000 in opposite directions through the substrate moving member 1300 and the gantry 2000. Hereinafter, for convenience of description, a case where the upper substrate unit S is linearly moved in one direction in a state where the position of the droplet discharger 4000 is fixed will be mainly described in more detail.

In the above case, the droplet discharger 4000 may supply at least one of the first material, the second material, and the third material to the upper substrate unit S.

When the above process is completed, the second capping layer CL2 may be formed on the upper substrate unit S and then it may be bonded to the display panel 10.

In relation to the above, in the droplet discharger 4000, a method of supplying at least one of the first material, the second material, and the third material to the upper substrate unit S and a method of bonding the upper substrate unit S to the display panel 10 will be described below in more detail.

Figure 8A:
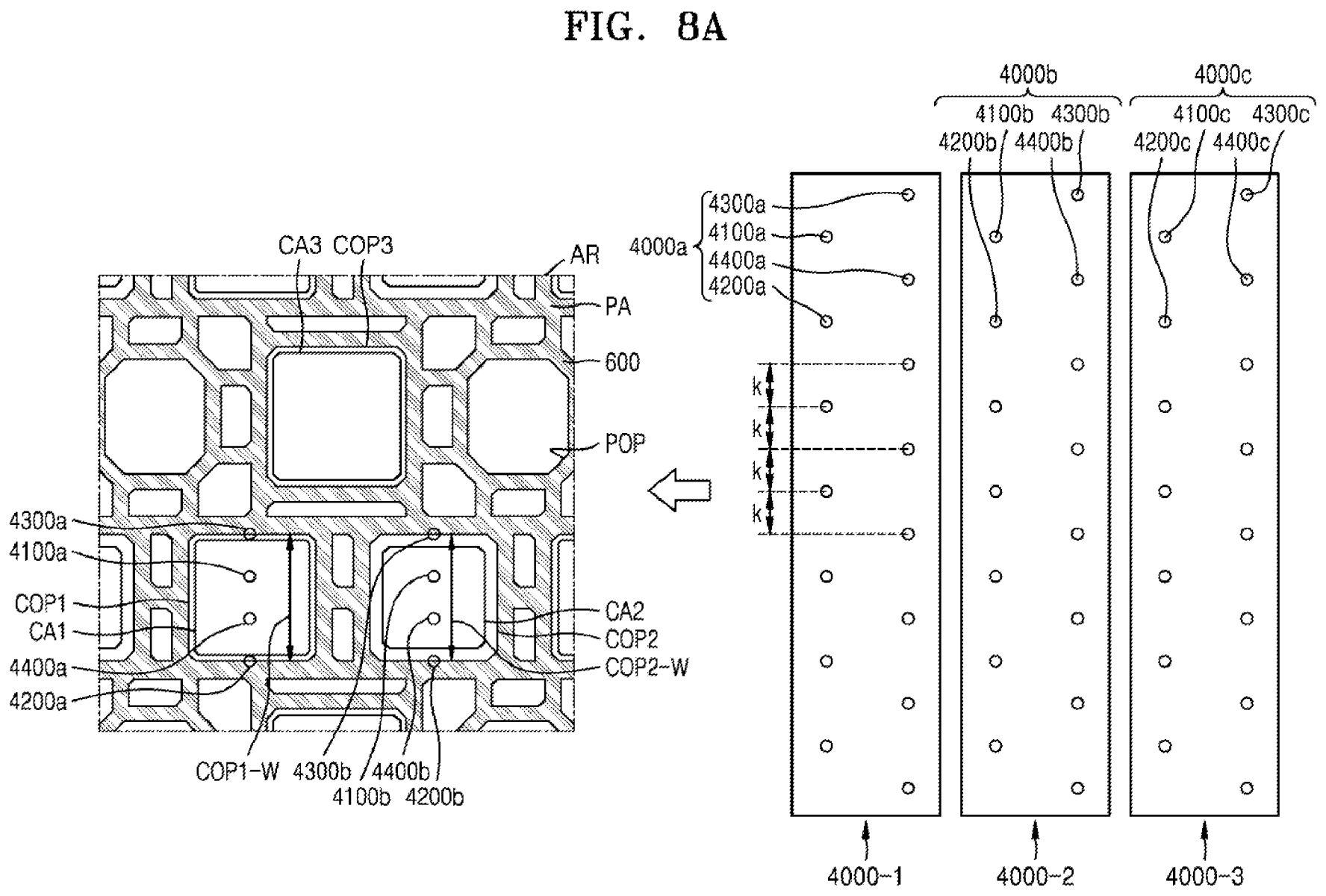

FIG. 8A is a plan view illustrating a method of manufacturing a display apparatus according to an embodiment.

Referring to FIG. 8A, when the upper substrate unit S moves linearly, the upper substrate unit S may move in the −x-axis direction. In this case, the first discharger 4000-1, the second discharger 4000-2, and the third discharger 4000-3 may respectively sequentially apply the first material, the second material, and the third material to the upper substrate portion or may respectively concurrently (e.g., simultaneously) supply the first material, the second material, and the third material to the upper substrate unit S.

In this case, the first discharger 4000-1 may include a plurality of first nozzles 4000a arranged in different columns and different rows. The plurality of first nozzles 4000a may include a (1-1)th nozzle 4100a, a (1-2)th nozzle 4200a, a (1-3)th nozzle 4300a, and a (1-4)th nozzle 4400a. The (1-1)th nozzle 4100a, the (1-2)th nozzle 4200a, the (1-3)th nozzle 4300a, and the (1-4)th nozzle 4400a may each be arranged in a line in one direction (e.g., the second direction). In this case, the (1-1)th nozzle 4100a and the (1-2)th nozzles 4200a may each be arranged in a zigzag or serpentine shape in the second direction. Also, the (1-3)th nozzle

4300a and the (1-4)th nozzle 4400a may each be arranged in a zigzag or serpentine shape in the second direction. When the (1-1)th nozzle 4100a, the (1-2)th nozzle 4200a, the (1-3)th nozzle 4300a, and the (1-4)th nozzle 4400a are projected in the first direction, the (1-1)th nozzle 4100a, the (1-2)th nozzle 4200a, the (1-3)th nozzle 4300a, and the (1-4)th nozzle 4400a may not overlap each other.

The second discharger 4000-2 may include a plurality of second nozzles 4000b like the first discharger 4000-1. The plurality of second nozzles 4000b may include a (2-1)th nozzle 4100b, a (2-2)th nozzle 4200b, a (2-3)th nozzle 4300b, and a (2-4)th nozzle 4400b respectively arranged equally or similarly to the (1-1)th nozzle 4100a, (1-2)th nozzle 4200a, the (1-3)th nozzle 4300a, and the (1-4)th nozzle 4400a of the first discharger 4000-1. The third discharger 4000-3 may include a plurality of third nozzles 4000c like the first discharger 4000-1. The plurality of third nozzles 4000c may include a (3-1)th nozzle 4100c, a (3-2)th nozzle 4200c, a (3-3)th nozzle 4300c, and a (3-4)th nozzle 4400c respectively arranged equally or similarly to the (1-1)th nozzle 4100a, (1-2)th nozzle 4200a, the (1-3)th nozzle 4300a, and the (1-4)th nozzle 4400a of the first discharger 4000-1.

In the above case, when the upper substrate unit S is arranged under each nozzle of each discharger, each nozzle may discharge a droplet. For example, when the (1-1)th nozzle 4100a of the first discharger 4000-1 is arranged over the first opening portion COP1, arranged on the edge of the first opening portion COP1, or spaced apart from the edge of the first opening portion COP1 by a set or certain distance, the (1-1)th nozzle 4100a may supply the first material to the first opening portion COP1. Also, in the above case, the (1-2)th nozzle 4200a, the (1-3)th nozzle 4300a, and the (1-4)th nozzle 4400a may operate like the (1-1)th nozzle 4100a. In the above case, the number of first nozzles 4000a supplying the first material to the first opening portion COP1 may be determined through Equation 1 below according to the first width COP1-W of the first opening portion COP1 in the second direction.

$$N=(a-x)/k \hspace{2cm} \text{[Equation 1]}$$

Here, N may denote the number of nozzles supplying a material to each opening center area, "a" may denote the width of each opening portion measured in the second direction, "x" may denote an impact margin, and "k" may denote an interval between nozzles. In this case, "x" may be a constant determined according to the type (or kind) of the droplet discharger, the manufacturer, and/or the type (or kind) of the material supplied by the droplet discharger, "a" may be determined when designing the color conversion panel, and "k" may be determined through the type (or kind) of the droplet discharger and the manufacturer or may be determined by actual measurement.

As described above, when the first opening portion COP1 passes under the droplet discharger 4000, the (1-1)th nozzle 4100a, the (1-2)th nozzle 4200a, the (1-3)th nozzle 4300a, and the (1-4)th nozzle 4400a may sequentially supply the first material to the first opening portion COP1 with a time difference.

The second material and the third material may be respectively supplied to the second opening portion COP2 and the third opening portion COP3 during and/or after the performance of the above process.

When the second material is supplied, because the second width COP2-W of the second opening portion COP2 measured in the second direction is equal to the first width COP1-W, the number of second nozzles 4000b passing through the second opening portion COP2 and the number of first nozzles 4000a passing through the first opening portion COP1 may be equal to each other. In this regard, when one of the number of first nozzles 4000a passing through the first opening portion COP1 and the number of second nozzles 4000b passing through the second opening portion COP2 is different from the other of the number of first nozzles 4000a passing through the first opening portion COP1 and the number of second nozzles 4000b passing through the second opening portion COP2, the time taken to supply a suitable or necessary amount of first material to the first opening portion COP1 and the time taken to supply a suitable or necessary amount of second material to the second opening portion COP2 may be different from each other. For example, when the amount of the first material to be supplied to the first opening portion COP1 and the amount of the second material to be supplied to the second opening portion COP2 are equal to each other, when the number of first nozzles 4000a passing over the first opening portion COP1 is 4 and the number of second nozzles 4000b passing over the second opening portion COP2 is 3, the time taken to supply a suitable or necessary amount of second material to the second opening portion COP2 may be greater than the time taken to supply a suitable or necessary amount of first material to the first opening portion COP1. In this case, an operation such as stopping the upper substrate unit S, reducing the speed of the upper substrate unit S, and/or stopping the operation of the first discharger 4000-1 should be performed. In this case, in order to supply all of the first material, the second material, and the third material to the entire upper substrate unit S, the operation time may increase. Also, because the controller 6000 should control various suitable devices in order to perform the above operation, the control of the display apparatus manufacturing apparatus may be complicated and/or a precise operation may not be performed due to a malfunction. In this case, because the functional layer 700 may not be formed in a precise pattern on the color conversion panel 20, an image provided by the finally manufactured display apparatus may not be clear. However, by making the first width COP1-W and the second width COP2-W equal to each other as described above, the above problems may be reduced.

The above operation may be performed on the front surface of the upper substrate unit S. In this case, the upper substrate unit S may move in the first direction and then may move again in the second direction and may move in a direction opposite to the first direction. By repeating this movement, the functional layer 700 may be formed on the entire upper substrate unit S.

Figure 8B:
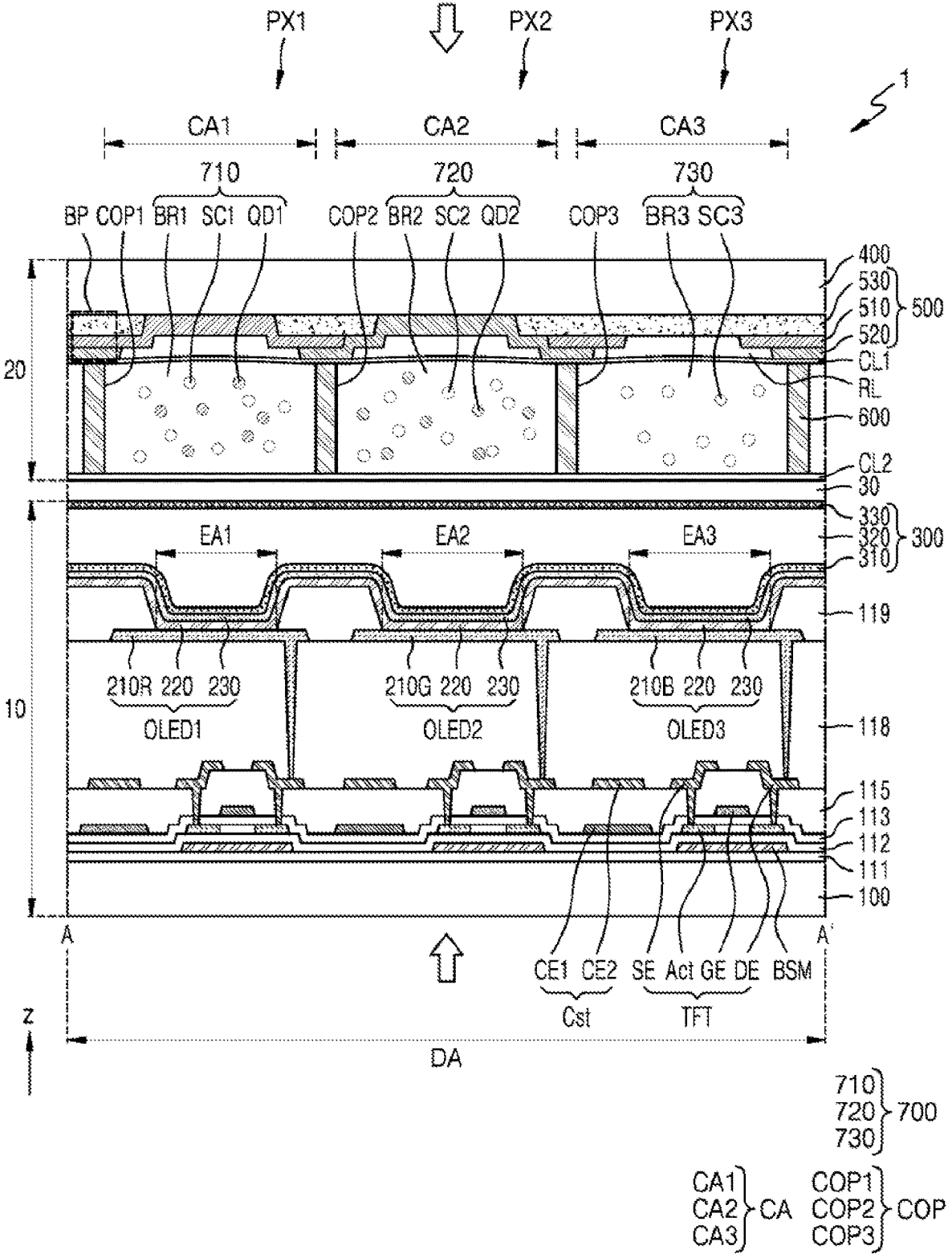
FIG. 8B is a cross-sectional view illustrating a method of manufacturing a display apparatus according to an embodiment.

FIG. 8B is a cross-sectional view illustrating a method of manufacturing a display apparatus according to an embodiment. In FIG. 8B, like reference numerals as those in FIGS. 3A and 3B denote like members.

Referring to FIG. 8B, the functional layer 700 may be formed on the upper substrate unit S and then the second capping layer CL2 may be formed on the functional layer 700 to complete the manufacture of the color conversion panel 20. Thereafter, the color conversion panel 20 and the display panel 10 may be arranged to face each other and then the color conversion panel 20 and the display panel 10 may be bonded to each other. In this case, the second capping layer CL2 and the encapsulation layer 300 may face each other.

In this case, the filling layer 30 may be arranged between the display panel and the color conversion panel 20. In an embodiment, the filling layer 30 may be arranged between the encapsulation layer 300 and the bank 600.

The display apparatus 1 manufactured as described above may implement a clear image. Also, the display apparatus 1 may reduce the occurrence of color mixing between the first subpixel PX1 and the second subpixel PX2 adjacent to each other.

Figure 9:
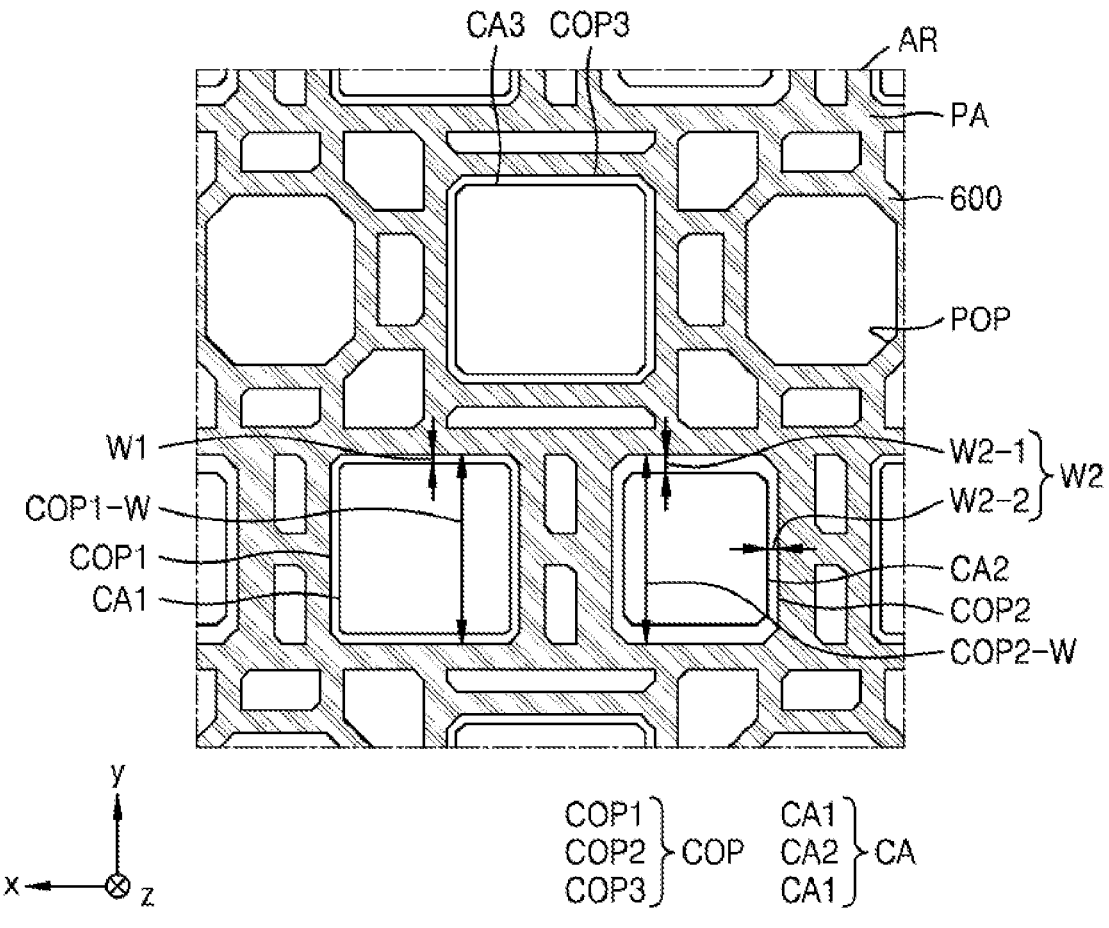
FIG. 9 is a plan view schematically illustrating a portion of a color conversion panel according to an embodiment.

FIG. 9 is a plan view schematically illustrating a portion of a color conversion panel according to an embodiment. FIG. 9 is an enlarged plan view of the color conversion panel 20 corresponding to region AR in the display apparatus 1 of FIG. 1.

Referring to FIG. 9, a display apparatus may include a color conversion panel and a display panel. In this case, the color conversion panel and the display panel may be similar to those described above with reference to FIGS. 1 to 4. Hereinafter, for the convenience of description, differences from the above description will be mainly described in more detail.

The color conversion panel may include an upper substrate, a color filter layer, a refractive layer, a first capping layer, a bank 600, a functional layer, and a second capping layer. In this case, because the upper substrate, the refractive layer, the first capping layer, the functional layer, and the second capping layer are the same as or similar to those described above with reference to FIGS. 3A and 3B, redundant descriptions thereof will not be repeated here for conciseness.

The color filter layer may define the transparent area CA. In this case, the peripheral area PA may be an area other than the transparent area CA. The transparent area CA may include a first transparent area CA1, a second transparent area CA2, and a third transparent area CA3. Because the first transparent area CA1 and the third transparent area CA3 are the same as or similar to those described above with reference to FIG. 4, redundant descriptions thereof will not be repeated here for conciseness.

The bank 600 may define an opening portion COP and a peripheral opening portion POP. The opening portion COP may include a first opening portion COP1, a second opening portion COP2, and a third opening portion COP3. In this case, because the first opening portion COP1, the third opening portion COP3, and the peripheral opening portion POP are the same as or similar to those described above with reference to FIG. 4, redundant descriptions thereof will not be repeated here for conciseness.

The planar shape of the second opening portion COP2 may be rectangular. In the plan view, the second transparent area CA2 may be arranged in the second opening portion COP2. In this case, the planar shape of the second transparent area CA2 may be rectangular or square. Hereinafter, for convenience of description, a case where the planar shape of the second transparent area CA2 is square will be mainly described in more detail.

In the plan view, the second distance W2 from the edge of the second opening portion COP2 to the edge of the second transparent area CA2 may be different from or equal to each other at different points of the edge of the second opening portion COP2. For example, a (2-1)th distance W2-1 from the edge of the second opening portion COP2 to the edge of the second transparent area CA2 measured in the second direction may be different from or equal to a (2-2)th distance W2-2 from the edge of the second opening portion COP2 to the edge of the second transparent area CA2 measured in the first direction. Hereinafter, for convenience of description, a case where the (2-1)th distance W2-1 and the (2-2)th distance W2-2 are different from each other will be mainly described in more detail.

In the plan view, the first distance W1 and the (2-1)th distance W2-1 from the edge of the first opening portion COP1 to the edge of the first transparent area CA1 measured in the second direction may be different from each other. In this case, the relationship between the first distance W1 and the (2-1)th distance W2-1 may be the same as or similar to the relationship between the first distance W1 and the second distance W2 described above with reference to FIG. 4.

In the above case, the first distance W1 may be about 4.9 µm or more and less than about 30 µm, and the second distance W2 may be about 5.5 µm or more and about 30 µm or less.

Also, in the above case, in the plan view, the first width COP1-W of the first opening portion COP1 and the second width COP2-W of the second opening portion COP2 measured in the second direction may be equal to each other.

Thus, the display apparatus including the color conversion panel described above may implement a clear image.

The display apparatus described above may be the same as or similar to those illustrated in FIGS. 3A and 3B. Also, the display apparatus may include a structure of any one of the light emitting devices illustrated in FIGS. 3A, 3B, and 5A to 6B.

Figure 10:
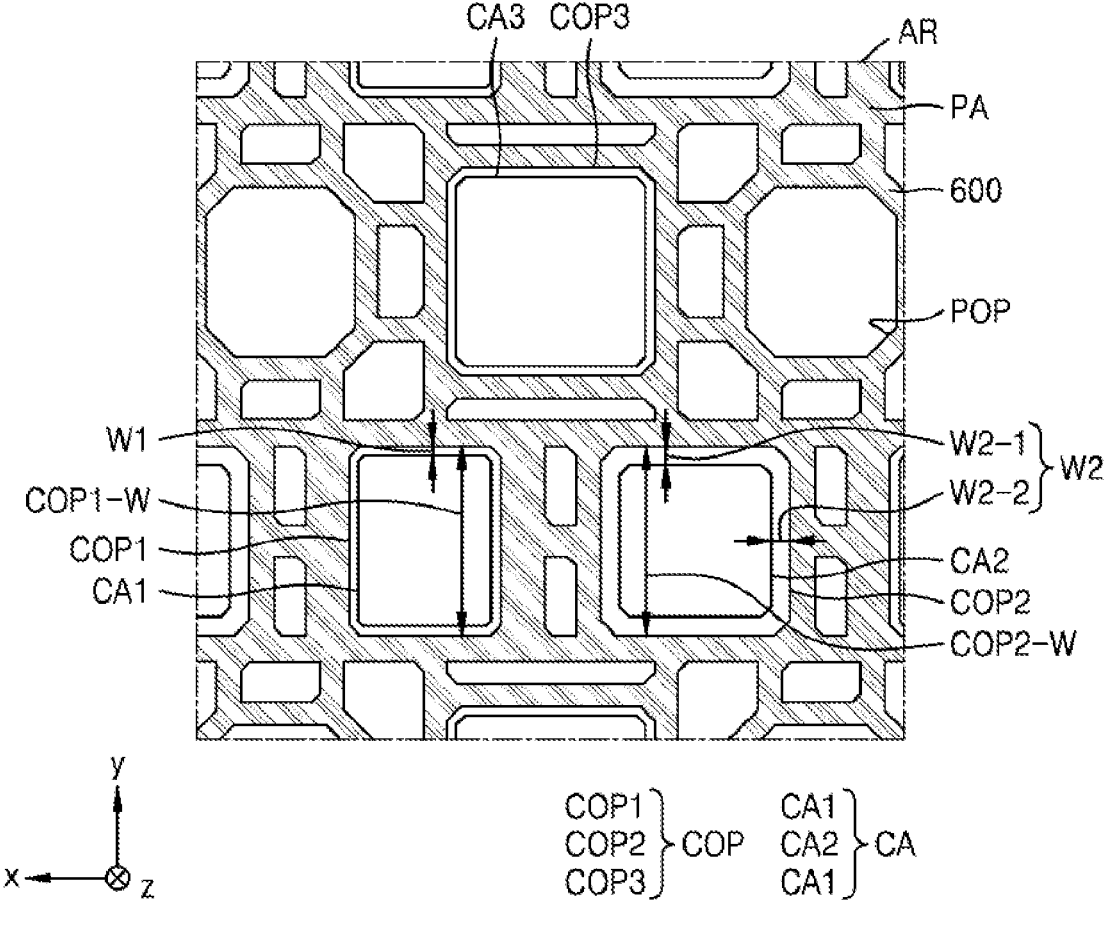
FIG. 10 is a plan view schematically illustrating a portion of a color conversion panel according to an embodiment.

FIG. 10 is a plan view schematically illustrating a portion of a color conversion panel according to an embodiment. FIG. 10 is an enlarged plan view of the color conversion panel 20 corresponding to region AR in the display apparatus 1 of FIG. 1.

Referring to FIG. 10, a display apparatus may include a color conversion panel and a display panel. In this case, the color conversion panel and the display panel may be similar to those described above with reference to FIGS. 1 to 4. Hereinafter, for the convenience of description, differences from the above description will be mainly described in more detail.

The color conversion panel may include an upper substrate, a color filter layer, a refractive layer, a first capping layer, a bank 600, a functional layer, and a second capping layer. In this case, because the upper substrate, the refractive layer, the first capping layer, the functional layer, and the second capping layer are the same as or similar to those described above with reference to FIGS. 3A and 3B, redundant descriptions thereof will not be repeated here for conciseness.

The color filter layer may define the transparent area CA. In this case, the peripheral area PA may be an area other than the transparent area CA. The transparent area CA may include a first transparent area CA1, a second transparent area CA2, and a third transparent area CA3. Because the second transparent area CA2 and the third transparent area CA3 are the same as or similar to those described above with reference to FIG. 4, redundant descriptions thereof will not be repeated for conciseness.

The bank 600 may define an opening portion COP and a peripheral opening portion POP. The opening portion COP may include a first opening portion COP1, a second opening portion COP2, and a third opening portion COP3. In this case, because the second opening portion COP2, the third opening portion COP3, and the peripheral opening portion POP are the same as or similar to those described above with reference to FIG. 4, redundant descriptions thereof will not be repeated here for conciseness.

The planar shape of the first opening portion COP1 may be rectangular. In the plan view, the first transparent area CA1 may be arranged in the first opening portion COP1. In this case, the planar shape of the first transparent area CA1 may be rectangular or square. Hereinafter, for convenience of description, a case where the planar shape of the first transparent area CA1 is rectangular will be mainly described in more detail.

In the plan view, the first distance W1 from the edge of the first opening portion COP1 to the edge of the first transparent area CA1 may be different from or equal to each other at different points of the edge of the first opening portion COP1. For example, a (1-1)th distance from the edge of the first opening portion COP1 to the edge of the first transparent area CA1 measured in the second direction may be different from or equal to a (1-2)th distance from the edge of the first opening portion COP1 to the edge of the first transparent area CA1 measured in the first direction. Hereinafter, for convenience of description, a case where the (1-1)th distance and the (1-2)th distance are equal to each other will be mainly described in more detail.

In the plan view, the first distance W1 and the second distance W2 from the edge of the second opening portion COP2 to the edge of the second transparent area CA2 measured in the second direction may be different from each other. In this case, the relationship between the first distance W1 and the second distance W2 may be the same as or similar to the relationship between the first distance W1 and the second distance W2 described above with reference to FIG. 4.

In the above case, the first distance W1 may be about 4.9 µm or more and less than about 30 µm, and the second distance W2 may be about 5.5 µm or more and about 30 µm or less.

Also, in the above case, in the plan view, the first width COP1-W of the first opening portion COP1 and the second width COP2-W of the second opening portion COP2 measured in the second direction may be equal to each other.

Thus, the display apparatus including the color conversion panel described above may implement a clear image.

The display apparatus described above may be the same as or similar to those illustrated in FIGS. 3A and 3B. Also, the display apparatus may include a structure of any one of the light emitting devices illustrated in FIGS. 3A, 3B, and 5A to 6B.

Moreover, in some embodiments, the second transparent area CA2 may be formed in a rectangular shape as illustrated in FIG. 9.

Figure 11:
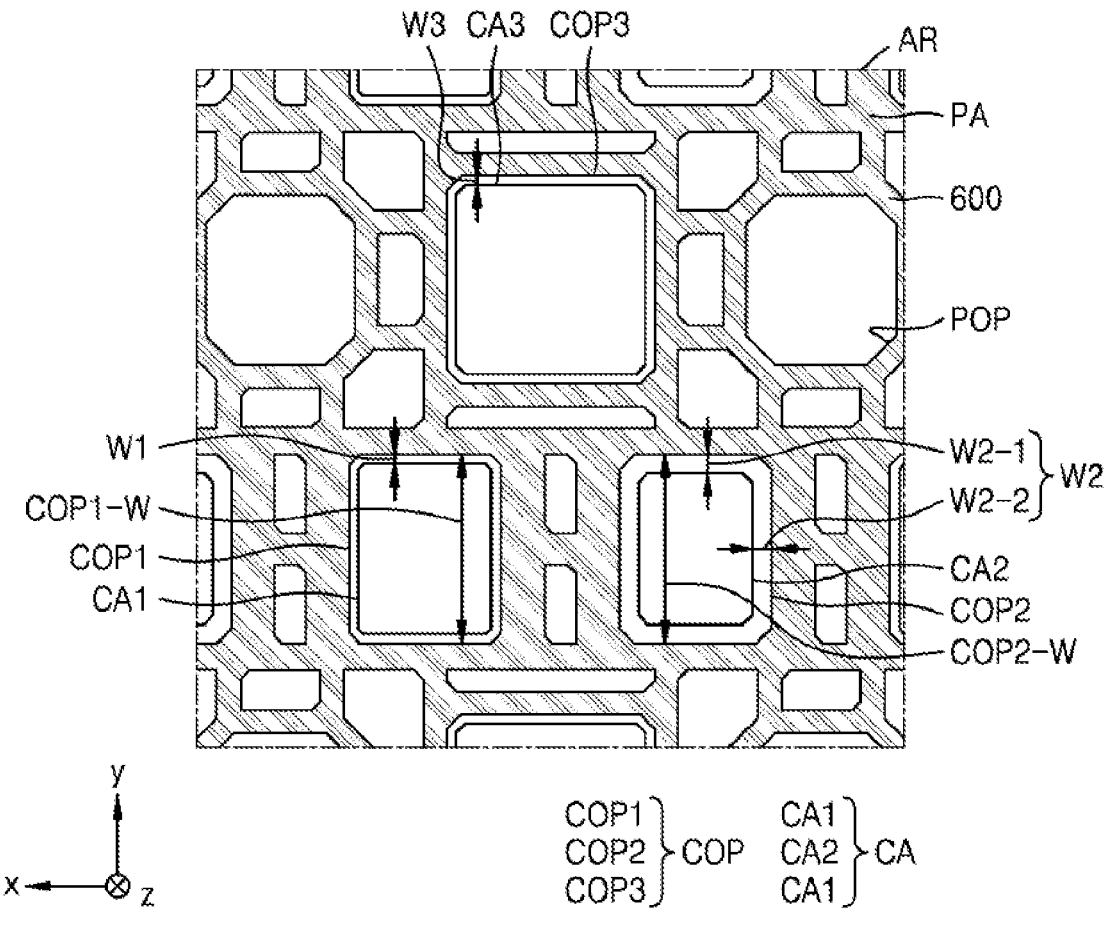
FIG. 11 is a plan view schematically illustrating a portion of a color conversion panel according to an embodiment.

FIG. 11 is a plan view schematically illustrating a portion of a color conversion panel according to an embodiment. FIG. 11 is an enlarged plan view of the color conversion panel 20 corresponding to region AR in the display apparatus 1 of FIG. 1.

Referring to FIG. 11, a display apparatus may include a color conversion panel and a display panel. In this case, the color conversion panel and the display panel may be similar to those described above with reference to FIGS. 1 to 4. Hereinafter, for the convenience of description, differences from the above description will be mainly described in more detail.

The color conversion panel may include an upper substrate, a color filter layer, a refractive layer, a first capping layer, a bank 600, a functional layer, and a second capping layer. In this case, because the upper substrate, the refractive layer, the first capping layer, the functional layer, and the second capping layer are the same as or similar to those described above with reference to FIGS. 3A and 3B, redundant descriptions thereof will not be repeated here for conciseness.

The color filter layer may define the transparent area CA. In this case, the peripheral area PA may be an area other than the transparent area CA. The transparent area CA may include a first transparent area CA1, a second transparent area CA2, and a third transparent area CA3. Because the third transparent area CA3 is the same as or similar to that described above with reference to FIG. 4, redundant descriptions thereof will not be repeated here for conciseness.

The bank 600 may define an opening portion COP and a peripheral opening portion POP. The opening portion COP may include a first opening portion COP1, a second opening portion COP2, and a third opening portion COP3. In this case, because the third opening portion COP3 and the peripheral opening portion POP are the same as or similar to those described above with reference to FIG. 4, redundant descriptions thereof will not be repeated here for conciseness.

The planar shape of the first opening portion COP1 and the planar shape of the second opening portion COP2 may be rectangular. In the plan view, the first transparent area CA1 may be arranged in the first opening portion COP1, and the second transparent area CA2 may be arranged in the second opening portion COP2. In this case, the planar shape of the first transparent area CA1 and the planar shape of the second transparent area CA2 may be rectangular or square. Hereinafter, for convenience of description, a case where the planar shape of the first transparent area CA1 and the planar shape of the second transparent area CA2 are rectangular will be mainly described in more detail.

In the plan view, the first distance W1 from the edge of the first opening portion COP1 to the edge of the first transparent area CA1 may be different from or equal to each other at different points of the edge of the first opening portion COP1. For example, a (1-1)th distance from the edge of the first opening portion COP1 to the edge of the first transparent area CA1 measured in the second direction may be different from or equal to a (1-2)th distance from the edge of the first opening portion COP1 to the edge of the first transparent area CA1 measured in the first direction. Hereinafter, for convenience of description, a case where the (1-1)th distance and the (1-2)th distance are equal to each other will be mainly described in more detail.

In the plan view, the second distance W2 from the edge of the second opening portion COP2 to the edge of the second transparent area CA2 may be different from or equal to each other at different points of the edge of the second opening portion COP2. For example, a (2-1)th distance from the edge of the second opening portion COP2 to the edge of the second transparent area CA2 measured in the second direction may be different from or equal to a (2-2)th distance from the edge of the second opening portion COP2 to the edge of the second transparent area CA2 measured in the first direction. Hereinafter, for convenience of description, a case where the (2-1)th distance and the (2-2)th distance are equal to each other will be mainly described in more detail.

In the plan view, the first distance W1 and the second distance W2 from the edge of the second opening portion COP2 to the edge of the second transparent area CA2 measured in the second direction may be different from each other. In this case, the relationship between the first distance W1 and the second distance W2 may be the same as or similar to the relationship between the first distance W1 and the second distance W2 described above with reference to FIG. 4.

In the above case, the first distance W1 may be about 4.9 μm or more and less than about 30 μm, and the second distance W2 may be about 5.5 μm or more and about 30 μm or less. In this case, the third distance W3 from the edge of the third opening portion COP3 to the edge of the third transparent area CA3 may be equal or similar to the first distance W1.

Also, in the above case, in the plan view, the first width COP1-W of the first opening portion COP1 and the second width COP2-W of the second opening portion COP2 measured in the second direction may be equal to each other. In this case, the size of the planar shape of the first opening portion COP1 and the size of the planar shape of the second opening portion COP2 may be equal to or different from each other.

Thus, the display apparatus including the color conversion panel described above may implement a clear image.

The display apparatus described above may be the same as or similar to those illustrated in FIGS. 3A and 3B. Also, the display apparatus may include a structure of any one of the light emitting devices illustrated in FIGS. 3A, 3B, and 5A to 6B.

Figure 12:
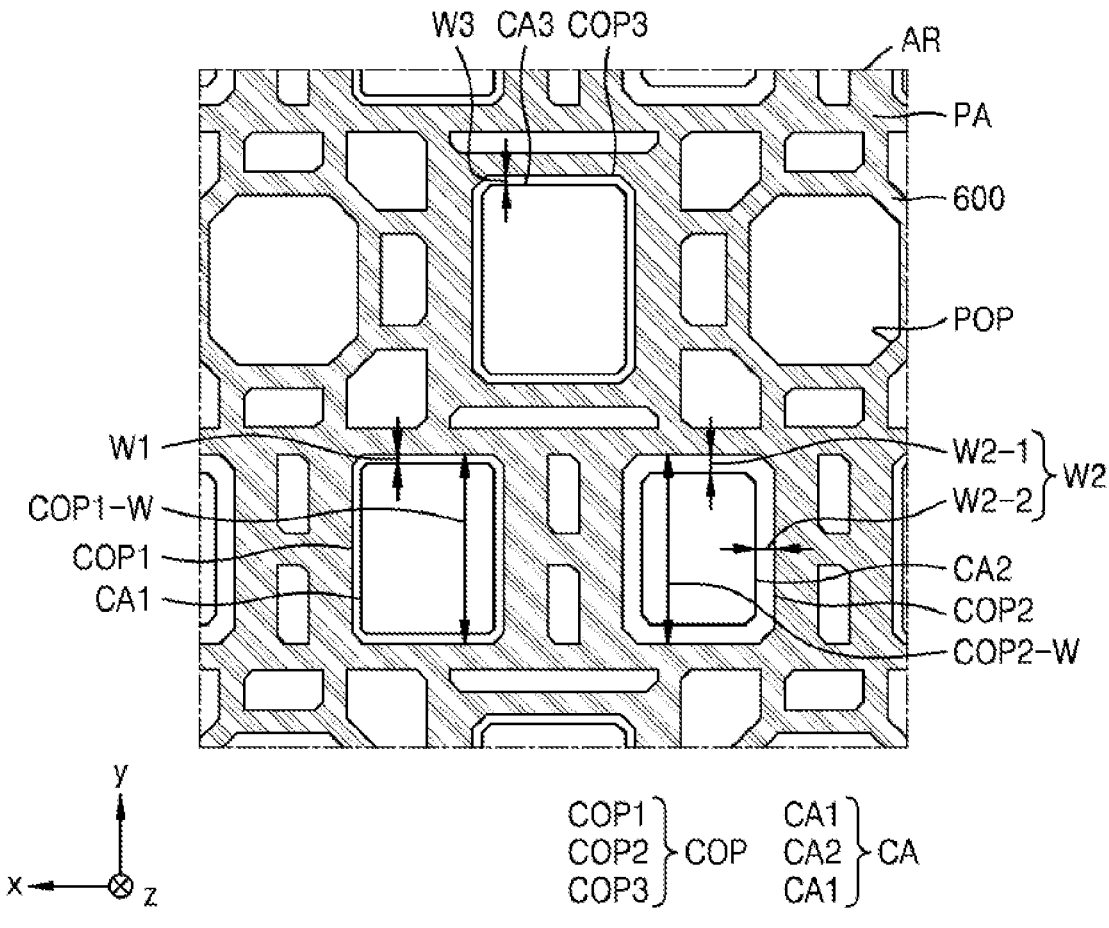
FIG. 12 is a plan view schematically illustrating a portion of a color conversion panel according to an embodiment.

FIG. 12 is a plan view schematically illustrating a portion of a color conversion panel according to an embodiment. FIG. 12 is an enlarged plan view of the color conversion panel 20 corresponding to region AR in the display apparatus 1 of FIG. 1.

Referring to FIG. 12, a display apparatus may include a color conversion panel and a display panel. In this case, the color conversion panel and the display panel may be similar to those described above with reference to FIGS. 1 to 4. Hereinafter, for the convenience of description, differences from the above description will be mainly described in more detail.

The color conversion panel may include an upper substrate, a color filter layer, a refractive layer, a first capping layer, a bank 600, a functional layer, and a second capping layer. In this case, because the upper substrate, the refractive layer, the first capping layer, the functional layer, and the second capping layer are the same as or similar to those described above with reference to FIGS. 3A and 3B, redundant descriptions thereof will not be repeated here for conciseness.

The color filter layer may define the transparent area CA. In this case, the peripheral area PA may be an area other than the transparent area CA. The transparent area CA may include a first transparent area CA1, a second transparent area CA2, and a third transparent area CA3. Because the third transparent area CA3 is the same as or similar to that described above with reference to FIG. 4, redundant descriptions thereof will not be repeated here for conciseness.

The bank 600 may define an opening portion COP and a peripheral opening portion POP. The opening portion COP may include a first opening portion COP1, a second opening portion COP2, and a third opening portion COP3. In this case, because the third opening portion COP3 and the peripheral opening portion POP are the same as or similar to those described above with reference to FIG. 4, redundant descriptions thereof will not be repeated here for conciseness.

The planar shape of the first opening portion COP1, the planar shape of the second opening portion COP2, and the planar shape of the third opening portion COP3 may be rectangular. In the plan view, the first transparent area CA1 may be arranged in the first opening portion COP1, the second transparent area CA2 may be arranged in the second opening portion COP2, and the third transparent area CA3 may be arranged in the third opening portion COP3. In this case, the planar shape of the first transparent area CA1, the planar shape of the second transparent area CA2, and the planar shape of the third transparent area CA3 may be rectangular or square. Hereinafter, for convenience of description, a case where all of the planar shape of the first transparent area CA1, the planar shape of the second transparent area CA2, and the planar shape of the third transparent area CA3 are rectangular will be mainly described in more detail.

In the plan view, the first distance W1 from the edge of the first opening portion COP1 to the edge of the first transparent area CA1 may be different from or equal to each other at different points of the edge of the first opening portion COP1. For example, a (1-1)th distance from the edge of the first opening portion COP1 to the edge of the first transparent area CA1 measured in the second direction may be different from or equal to a (1-2)th distance from the edge of the first opening portion COP1 to the edge of the first transparent area CA1 measured in the first direction. Hereinafter, for convenience of description, a case where the (1-1)th distance and the (1-2)th distance are equal to each other will be mainly described in more detail.

In the plan view, the second distance W2 from the edge of the second opening portion COP2 to the edge of the second transparent area CA2 may be different from or equal to each other at different points of the edge of the second opening portion COP2. For example, a (2-1)th distance W2-1 from the edge of the second opening portion COP2 to the edge of the second transparent area CA2 measured in the second direction may be different from or equal to a (2-2)th distance W2-2 from the edge of the second opening portion COP2 to the edge of the second transparent area CA2 measured in the first direction. Hereinafter, for convenience of description, a case where the (2-1)th distance W2-1 and the (2-2)th distance W2-2 are equal to each other will be mainly described in more detail.

In the plan view, the third distance W3 from the edge of the third opening portion COP3 to the edge of the third transparent area CA3 may be different from or equal to each other at different points of the edge of the third opening portion COP3. For example, a (3-1)th distance from the edge of the third opening portion COP3 to the edge of the third transparent area CA3 measured in the second direction may be different from or equal to a (3-2)th distance from the edge of the third opening portion COP3 to the edge of the third transparent area CA3 measured in the first direction. In this case, the positions of the (3-1)th distance and the (3-2)th distance may respectively correspond to the (2-1)th distance W2-1 and the (2-2)th distance W2-2 illustrated in FIG. 9. Hereinafter, for convenience of description, a case where the (3-1)th distance and the (3-2)th distance are equal to each other will be mainly described in more detail.

In the plan view, the first distance W1 and the (2-1)th distance W2-1 from the edge of the second opening portion COP2 to the edge of the second transparent area CA2 measured in the second direction may be different from each other. In this case, the relationship between the first distance W1 and the (2-1)th distance W2-1 may be the same as or similar to the relationship between the first distance W1 and the second distance W2 described above with reference to FIG. 4.

In the above case, the first distance W1 may be about 4.9 μm or more and less than about 30 μm, and the second distance W2 may be about 5.5 μm or more and about 30 μm or less. In this case, the third distance W3 from the edge of the third opening portion COP3 to the edge of the third transparent area CA3 may be equal or similar to the first distance W1.

Also, in the above case, in the plan view, the first width COP1-W of the first opening portion COP1 and the second width COP2-W of the second opening portion COP2 measured in the second direction may be equal to each other. In this case, the size of the planar shape of the first opening portion COP1 and the size of the planar shape of the second opening portion COP2 may be equal to or different from each other.

Thus, the display apparatus including the color conversion panel described above may implement a clear image.

In some embodiments, the first opening portion COP1, the second opening portion COP2, the first transparent area CA1, and the second transparent area CA2 may have one of the shapes illustrated in FIGS. 9 to 11.

The display apparatus described above may be the same as or similar to those illustrated in FIGS. 3A and 3B. Also, the display apparatus may include a structure of any one of the light emitting devices illustrated in FIGS. 3A, 3B, and 5A to 6B.

Figure 13:
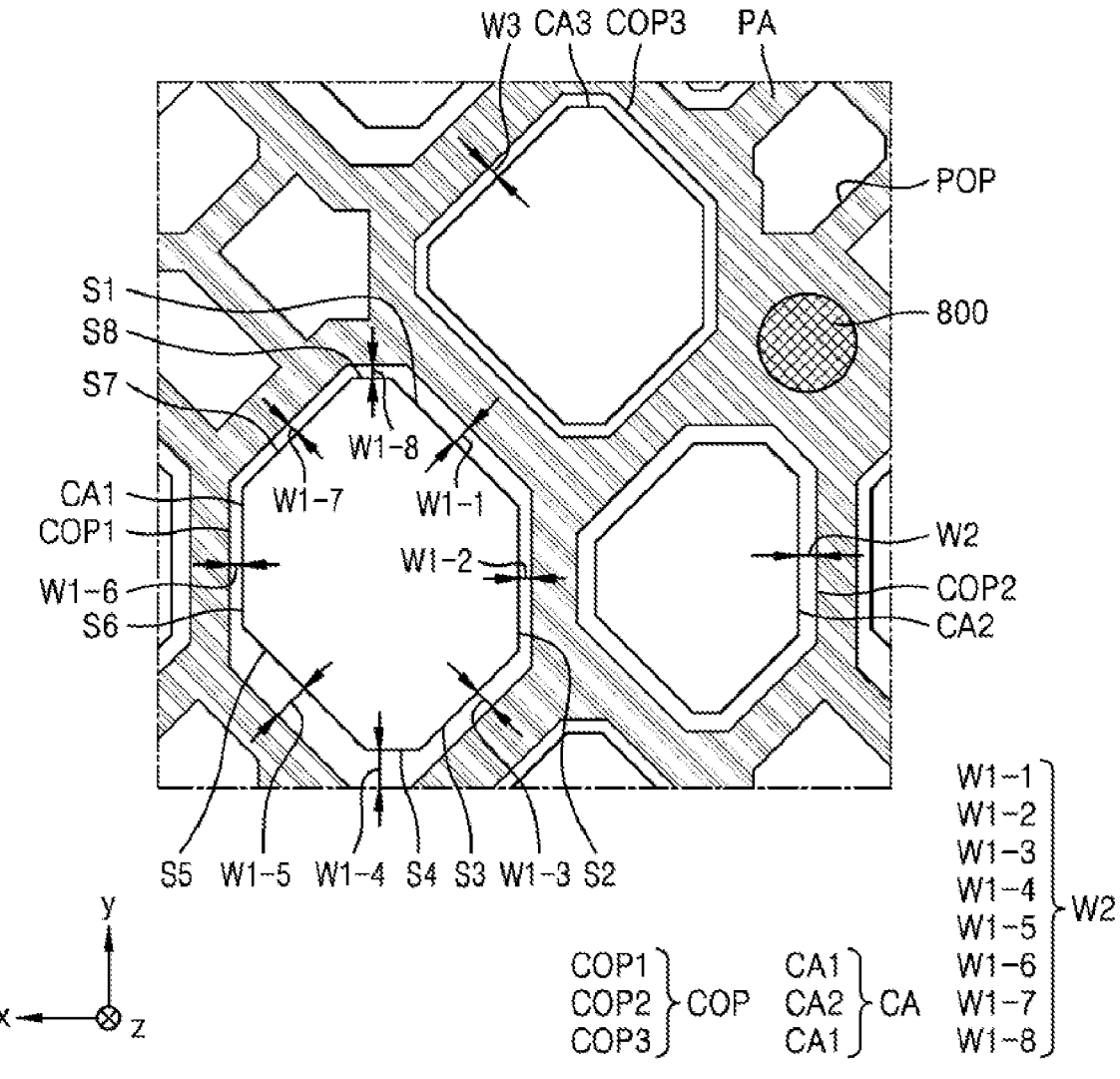
FIG. 13 is a plan view schematically illustrating a portion of a color conversion panel according to an embodiment.

FIG. 13 is a plan view schematically illustrating a portion of a color conversion panel according to an embodiment. FIG. 13 is an enlarged plan view of the color conversion panel 20 corresponding to region AR in the display apparatus 1 of FIG. 1.

Referring to FIG. 13, a color conversion panel may include a transparent area CA and a peripheral area PA. In this case, the peripheral area PA may be a light blocking area, and a column spacer 800 may be arranged in the peripheral area PA. The transparent area CA may include a first transparent area CA1, a second transparent area CA2, and a third transparent area CA3 that are arranged apart from each other. In this case, the first transparent area CA1, the second transparent area CA2, and the third transparent area CA3 may be arranged such that the centers thereof may form a triangle. For example, the first transparent area CA1 and the second transparent area CA2 may be arranged in a line in the first direction. In this case, the first transparent area CA1 and the second transparent area CA2 may be respectively provided as a plurality of first transparent areas CA1 and a plurality of second transparent areas CA2, and some of the plurality of first transparent areas CA1 and some of the second transparent areas CA2 may be alternately arranged in the first direction. Also, some others of the plurality of first transparent areas CA1 and some others of the plurality of second transparent areas CA2 may be arranged to be spaced apart from each other in the second direction. The third transparent area CA3 may be arranged to be spaced apart from the first transparent area CA1 and the second transparent area CA2 in the second direction. In this case, a plurality of third transparent areas CA3 may be provided, and the plurality of third transparent areas CA3 may be arranged to be spaced apart from each other in the first direction and the second direction. In this case, each of the third transparent areas CA3 may not be arranged in the same line as the first transparent area CA1 or the second transparent area CA2 in the first direction and the second direction.

The planar shape of each of the first transparent area CA1, the second transparent area CA2, and the third transparent area CA3 described above may be octagonal. In this case, the first transparent area CA1, the second transparent area CA2, and the third transparent area CA3 may be defined through the color filter layer as illustrated in FIGS. 3A and 3B.

The bank 600 may include an opening portion COP and a peripheral opening portion POP. In this case, because the peripheral opening portion POP is the same as or similar to those described above with reference to FIGS. 9 to 12, redundant descriptions thereof will not be repeated for conciseness.

The opening portion COP may include a first opening portion COP1, a second opening portion COP2, and a third opening portion COP3. In this case, the first opening portion COP1, the second opening portion COP2, and the third opening portion COP3 may be arranged to respectively correspond to the first transparent area CA1, the second transparent area CA2, and the third transparent area CA3. In this case, the first opening portion COP1, the second opening portion COP2, and the third opening portion COP3 may be octagonal.

In the above case, in the plan view, the first distance W1 from the edge of the first opening portion COP1 to the edge of the first transparent area CA1 may be different from each other at one point of the edge of the first transparent area CA1. In some embodiments, the planar shape of the first transparent area CA1 may include a first side S1, a second side S2, a third side S3, a fourth side S4, a fifth side S5, a sixth side S6, a seventh side S7, and an eighth side S8. In this case, the first side S1 may face the fifth side S5, the second side S2 may face the sixth side S6, the third side S3 may face the seventh side S7, and the fourth side S4 may face the eighth side S8. One of a (1-1)th distance W1-1 from the first side S1 to the edge of the first opening portion COP1, a (1-2)th distance W1-2 from the second side S2 to the edge of the first opening portion COP1, a (1-3)th distance W1-3 from the third side S3 to the edge of the first opening portion COP1, a (1-4)th distance W1-4 from the fourth side S4 to the edge of the first opening portion COP1, a (1-5)th distance W1-5 from the fifth side S5 to the edge of the first opening portion COP1, a (1-6)th distance W1-6 from the sixth side S6 to the edge of the first opening portion COP1, a (1-7)th distance W1-7 from the seventh side S7 to the edge of the first opening portion COP1, and a (1-8)th distances W1-8 from the eighth side S8 to the edge of the first opening portion COP1 may be different from another of the (1-1)th distance W1-1, the (1-2)th distance W1-2, the (1-3)th distance W1-3, the (1-4)th distance W1-4, the (1-5)th distance W1-5, the (1-6)th distance W1-6, the (1-7)th distance W1-7, and the (1-8)th distance W1-8.

For example, the (1-1)th distance W1-1 may be different from the (1-2)th distance W1-2, the (1-6)th distance W1-6, the (1-7)th distance W1-7, and the (1-8)th distance W1-8. Also, the (1-1)th distance W1-1 may be different from the (1-5)th distance W1-5 and may be equal to the (1-3)th distance W1-3. In this case, the (1-2)th distance W1-2, the (1-6)th distance W1-6, the (1-7)th distance W1-7, and the (1-8)th distance W1-8 may be equal to each other. In this case, the first side S1 and the third side S3 may be arranged to face one side of the third opening portion COP3, and the fifth side S5 may be arranged to face one side of the peripheral opening portion POP. Also, the second side S2 and the sixth side S6 may be arranged to face the second opening portion COP2.

In this case, the (1-1)th distance W1-1 may be greater than the (1-2)th distance W1-2 and may be less than the (1-5)th distance W1-5. Also, the (1-2)th distance W1-2 may be less than the (1-5)th distance W1-5.

In the above case, the (1-1)th distance W1-1 to the (1-8)th distance W-18 and the third distance W3 may be about 4.9 μm or more and less than about 30 μm, and the second distance W2 may be about 5.5 μm or more and about 30 μm or less.

In the above case, when the (1-1)th distance W1-1 and the (1-3)th distance W1-3 are equal to the (1-2)th distance W1-2 at the first side S1 and the third side S3 facing the third opening portion COP3, because the light having passed through the first transparent area CA1 and the light having passed through the third transparent area CA3 are mixed together with each other, the color matching rate may be degraded. However, by making the (1-1)th distance W1-1 and the (1-3)th distance W1-3 greater than the (1-2)th distance W1-2 as described above, by reducing the mixing of the light having passed through the first transparent area CA1 and the light having passed through the third transparent area CA3 as described above, a clear image may be provided. In this case, the (1-1)th distance W1-1 and the (1-3)th distance W1-3 may about 7.5 μm or more and less than about 30 μm. Also, the (1-5)th distance W1-5 may be about 13.9 μm or more and less than about 30 μm.

Thus, the color matching rate of the display apparatus may increase because the lights having passed through the adjacent transparent areas do not mix together with each other. Also, the display apparatus may provide a clear image.

The display apparatus described above may be the same as or similar to those illustrated in FIGS. 3A and 3B. Also, the display apparatus may include a structure of any one of the light emitting devices illustrated in FIGS. 3A, 3B, and 5A to 6B.

The color reproducibility of display apparatuses according to embodiments may be improved. Also, the display apparatuses according to embodiments may provide clear images.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A display apparatus comprising:
a display panel comprising a first light emitting device and a second light emitting device; and
a color conversion panel comprising a color pattern that defines a first transparent area and a second transparent area respectively corresponding to the first light emitting device and the second light emitting device and a bank the defines a first opening portion and a second opening portion respectively corresponding to the first transparent area and the second transparent area,
wherein at least one of a planar shape of the first opening portion and a planar shape of the second opening portion is a square, and, in a plan view, a first distance from a first point of an edge of the first transparent area to an edge of the first opening portion, which is measured in a first direction, and a second distance from a second point of an edge of the second transparent area arranged at a position corresponding to the first point to an edge of the second opening portion, which is measured in the first direction, are different from each other.

2. The display apparatus of claim 1, wherein, in a plan view, an area of the first transparent area and an area of the second transparent area are different from each other.

3. The display apparatus of claim 1, wherein, in a plan view, the first opening portion and the second opening portion have a same planar shape.

4. The display apparatus of claim 1, wherein the first light emitting device and the second light emitting device each emit a same color.

5. The display apparatus of claim 1, wherein the first distance is less than the second distance.

6. The display apparatus of claim 1, wherein the first distance is about 4.9 μm or more and less than about 30 μm.

7. The display apparatus of claim 1, wherein the second distance is about 5.5 μm or more and about 30 μm or less.

8. The display apparatus of claim 1, wherein the second opening portion is rectangular.

9. The display apparatus of claim 1, wherein the first transparent area is square.

10. The display apparatus of claim 1, wherein the second transparent area is rectangular or square.

11. The display apparatus of claim 1, wherein a third distance measured at another point of the edge of the second opening portion in a second direction different from the first direction is equal to or different from the second distance.

12. The display apparatus of claim 1, wherein the color pattern comprises:
a first color filter arranged in the first transparent area; and
a second color filter arranged in the second transparent area.

13. The display apparatus of claim 12, wherein the color pattern further comprises a third color filter comprising a pattern area that exposes the first transparent area and the second transparent area.

14. The display apparatus of claim 13, wherein the first transparent area and the second transparent area are defined as the third color filter.

15. The display apparatus of claim 12, wherein the first color filter transmits light of a red wavelength, and the second color filter transmits light of a blue wavelength.

16. The display apparatus of claim 1, wherein the color conversion panel further comprises:
a first quantum dot arranged in the first opening portion; and
a second quantum dot arranged in the second opening portion.

17. The display apparatus of claim 1, wherein a first width of the first opening portion and a second width of the second opening portion measured in the first direction are equal to each other.

18. A display apparatus comprising:
a display panel comprising a first light emitting device and a second light emitting device; and
a color conversion panel comprising a color pattern that defines a first transparent area and a second transparent area respectively corresponding to the first light emitting device and the second light emitting device and a bank that defines a first opening portion and a second opening portion respectively corresponding to the first transparent area and the second transparent area,
wherein a planar shape of the first opening portion and a planar shape of the second opening portion are square, and an area of the planar shape of the first opening portion and an area of the planar shape of the second opening portion are equal to each other.

19. The display apparatus of claim 18, wherein the first light emitting device and the second light emitting device each emit a same color.

20. The display apparatus of claim 18, wherein, in a plan view, a first distance from a first point of an edge of the first transparent area to an edge of the first opening portion, which is measured in a first direction, is less than a second distance from a second point of an edge of the second transparent area arranged at a position corresponding to the first point to an edge of the second opening portion, which is measured in the first direction.

21. The display apparatus of claim 18, wherein, in a plan view, a first distance from a first point of an edge of the first transparent area to an edge of the first opening portion measured in a first direction is about 4.9 μm or more and less than about 30 μm.

22. The display apparatus of claim 18, wherein a second distance from a second point of an edge of the second transparent area to an edge of the second opening portion measured in a first direction is about 5.5 μm or more and about 30 μm or less.

23. The display apparatus of claim 18, wherein at least one of a planar shape of the first transparent area and a planar shape of the second transparent area is rectangular or square.

24. A display apparatus comprising:
a display panel comprising a plurality of light emitting devices; and
a color conversion panel comprising a color pattern that defines a first transparent area corresponding to one of the plurality of light emitting devices and a bank that defines a first opening portion corresponding to the first transparent area,
wherein a planar shape of the first opening portion is octagonal, and, in a plan view, a first distance measured from a first side of the planar shape of the first opening portion to an edge of a planar shape of the first transparent area is different from a second distance measured from a second side of the planar shape of the first opening portion to the edge of the planar shape of the first transparent area.

25. The display apparatus of claim 24, wherein the first side and the second side are arranged to face each other with respect to a center of the first opening portion.

26. The display apparatus of claim 25, wherein the color pattern defines a second transparent area arranged to be adjacent to the first transparent area and corresponding to another of the plurality of light emitting devices and the bank defines a peripheral opening portion arranged around the first transparent area, and
the first side faces the second transparent area and the second side faces the peripheral opening portion.

27. The display apparatus of claim 26, wherein the first distance is less than the second distance.

28. The display apparatus of claim 24, wherein the first distance and the second distance are each about 4.9 μm or more and less than about 30 μm.

29. The display apparatus of claim 24, wherein the plurality of light emitting devices each emit a same color.

30. The display apparatus of claim 24, wherein the color pattern defines a second transparent area arranged to be adjacent to the first transparent area and corresponding to another one of the plurality of light emitting devices and a third transparent area arranged to be adjacent to the first transparent area and corresponding to another of the plurality of light emitting devices, and
the first side faces the second transparent area and the second side faces the third transparent area.

31. The display apparatus of claim 30, wherein the first distance is greater than the second distance.

32. The display apparatus of claim 30, wherein the color pattern comprises:
a first color filter arranged in the first transparent area;
a second color filter arranged in the second transparent area; and
a third color filter arranged in the third transparent area.

33. A display apparatus comprising:

a display panel comprising a first light emitting device, a second light emitting device, and a third light emitting device arranged to be spaced apart from each other; and a color conversion panel comprising a color pattern that defines a first transparent area, a second transparent area, and a third transparent area respectively corresponding to the first light emitting device, the second light emitting device, and the third light emitting device and a bank that defines a first opening portion, a second opening portion, and a third opening portion respectively corresponding to the first transparent area, the second transparent area, and the third transparent area, wherein the first opening portion and the second opening portion are arranged in a line in a first direction and the third opening portion is arranged to be spaced apart from the first opening portion and the second opening portion in a second direction, and, in a plan view, a first width of the first opening portion and a second width of the second opening portion measured in the second direction are equal to each other.

34. The display apparatus of claim 33, wherein a planar shape of at least one of the first opening portion, the second opening portion, and the third opening portion is square or rectangular.

35. The display apparatus of claim 33, wherein at least one of planar shapes of the first transparent area, the second transparent area, and the third transparent area is rectangular or square.

36. The display apparatus of claim 33, wherein, in a plan view, a first distance from a first point of an edge of the first transparent area to an edge of the first opening portion, which is measured in the second direction, and a second distance from a second point of an edge of the second transparent area arranged at a position corresponding to the first point to an edge of the second opening portion, which is measured in the first direction, are different from each other.

37. The display apparatus of claim 36, wherein the first distance is less than the second distance.

38. The display apparatus of claim 36, wherein the first distance is about 4.9 μm or more and less than about 30 μm.

39. The display apparatus of claim 36, wherein the second distance is about 5.5 μm or more and about 30 μm or less.

40. The display apparatus of claim 33, wherein the first light emitting device and the second light emitting device each emit a same color.

41. The display apparatus of claim 33, wherein an area of a planar shape of the first opening portion is equal to an area of a planar shape of the second opening portion.

42. The display apparatus of claim 33, wherein the first opening portion and the second opening portion are respectively provided as a plurality of first opening portions and a plurality of second opening portions, and each of the plurality of first opening portions and each of the plurality of second opening portions are arranged in a line in the second direction and are arranged to alternate with each other in the first direction.

* * * * *